(12) United States Patent
Okugawa

(10) Patent No.: US 9,351,082 B2
(45) Date of Patent: May 24, 2016

(54) CAPACITANCE-TYPE TRANSDUCER

(71) Applicant: OMRON Corporation, Kyoto (JP)

(72) Inventor: Akihiro Okugawa, Kyoto (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 14/635,892

(22) Filed: Mar. 2, 2015

(65) Prior Publication Data

US 2015/0264464 A1    Sep. 17, 2015

(30) Foreign Application Priority Data

Mar. 14, 2014   (JP) ................... 2014-052134

(51) Int. Cl.
  *H04R 25/00*  (2006.01)
  *H04R 19/00*  (2006.01)

(52) U.S. Cl.
  CPC ........ *H04R 19/005* (2013.01); *H04R 2201/003* (2013.01)

(58) Field of Classification Search
  CPC .................. H04R 19/005; H04R 2201/003
  See application file for complete search history.

(56) References Cited

U.S. PATENT DOCUMENTS

| | | | | |
|---|---|---|---|---|
| 2011/0278684 | A1* | 11/2011 | Kasai | ............ G01H 11/06 257/416 |
| 2011/0280419 | A1* | 11/2011 | Kasai | ............ H04R 19/005 381/176 |
| 2012/0213400 | A1* | 8/2012 | Kasai | ............ H04R 19/04 381/369 |
| 2015/0230027 | A1* | 8/2015 | Inoue | ............ H04R 19/00 381/191 |

FOREIGN PATENT DOCUMENTS

JP    5252104 B1    7/2013

* cited by examiner

*Primary Examiner* — Tuan D Nguyen
(74) *Attorney, Agent, or Firm* — Osha Liang LLP

(57) ABSTRACT

A capacitance-type transducer has a back plate having a fixed electrode, a diaphragm that opposes the back plate via an air gap and serves as a movable electrode, and at least first stoppers having a first projection length and second stoppers having a second projection length that project from at least one of a surface of the back plate on the air gap side and a surface of the diaphragm on the air gap side. At least one of the diaphragm and the fixed electrode is divided into at least a first region having a first surface area and a second region having a second surface area, a first sensing portion made up of the diaphragm and the fixed electrode is constituted in the first region, and a second sensing portion made up of the diaphragm and the fixed electrode is constituted in the second region.

18 Claims, 20 Drawing Sheets

| Stopper projection length [μm] | Maximum stress ratio [%] |
|---|---|
| 1.0 | 100 |
| 2.0 | 85.3 |
| 2.5 | 76.3 |
| 3.0 | 67.9 |

CAPACITANCE-TYPE TRANSDUCER

BACKGROUND

1. Field

The present invention relates to a capacitance-type transducer. Specifically, the present invention relates to a capacitance-type transducer constituted by a capacitor structure made up of movable electrodes (diaphragm) and fixed electrodes.

2. Related Art

In recent years, there has been demand for microphones to detect sounds with high sensitivity in a range from low sound pressure to high sound pressure. Accordingly, if the harmonic distortion rate can be reduced, it is possible to raise the maximum input sound pressure and widen the detectable sound pressure range (referred to hereinafter as the "dynamic range") of the microphone. However, in general microphones, there is a trade-off relationship between an improvement in the acoustic vibration detection sensitivity and a reduction in the harmonic distortion rate, and it has been difficult to provide a microphone with a wide dynamic range from low-volume (low sound pressure) sounds to high-volume (high sound pressure) sounds.

In view of these circumstances, Japanese Patent No. 5252104 (referred to hereinafter as "Patent Document 1") discloses a microphone in which the diaphragm is divided into two so as to be constituted by a low-volume high-sensitivity sensing portion and a high-volume low-sensitivity sensing portion, in order to widen the dynamic range of the microphone.

FIG. 1A is a schematic diagram showing the structure of an acoustic sensor 11 used in the microphone disclosed in Patent Document 1. In this acoustic sensor 11, the diaphragm is divided into two diaphragms by a slit 17, one diaphragm (first diaphragm 12a) having a comparatively large surface area, and the other diaphragm (second diaphragm 12b) having a comparatively small surface area. A fixed electrode 13 opposes the first diaphragm 12a and the second diaphragm 12b across an air gap, and the fixed electrode 13 is held by a back plate 14. In this acoustic sensor 11, a low-volume high-sensitivity first sensing portion 15a is constituted by the first diaphragm 12a and the opposing portion of the fixed electrode 13, and a high-volume low-sensitivity second sensing portion 15b is constituted by the second diaphragm 12b and the opposing portion of the fixed electrode 13. The dynamic range of the microphone is widened by switching the output from the acoustic sensor 11 between output from the first sensing portion 15a and output from the second sensing portion 15b in accordance with the volume.

Japanese Patent No. 5252104 is an example of background art.

In a capacitance type of acoustic sensor, when the diaphragm bends a large amount and comes into contact with the back plate, it is possible for the diaphragm to become attached to the back plate and not return to its original state (this phenomenon will be called "sticking"). Examples of cases where the diaphragm bends a large amount and sticking occurs include the case where the diaphragm is subjected to a loud sound, the case where the diaphragm of the acoustic transducer is subjected to high compressed air pressure (wind pressure) due to being dropped in a drop resistance test, and the case where air is forcefully blown into the acoustic sensor.

If the diaphragm becomes stuck to the back plate, vibration of the diaphragm is hindered, and it becomes impossible for the acoustic sensor to detect acoustic vibration. For this reason, in the acoustic sensor 11 shown in FIG. 1A, many stoppers 16 having a uniform projection length are provided on the back plate 14, and sticking of the diaphragms 12a and 12b is prevented by the stoppers 16.

However, the length (projection length) of the stoppers 16 influences the resistance of the diaphragms 12a and 12b to damage (damage resistance) and the resistance to sticking (sticking resistance). This point will be described below with reference to FIGS. 1B and 1C.

If the stoppers 16 are short as shown in FIG. 1B, the gap between the diaphragms 12a and 12b and the stoppers 16 is wide when no deformation is occurring, and therefore the diaphragms 12a and 12b can undergo a large amount of deformation. Also, when the same pressure is applied, the first diaphragm 12a will undergo more deformation than the second diaphragm 12b. The first diaphragm 12a therefore more easily comes into contact with the stoppers 16, and more elastic restoration force is generated upon coming into contact with the stoppers 16, and therefore the first diaphragm 12a more easily detaches from the stoppers 16 (is less likely to become stuck). In contrast, the second diaphragm 12b has a comparatively smaller surface area and higher rigidity, and therefore normally does not undergo a large amount of deformation. However, it undergoes a large amount of deformation when subjected to a high pressure load in a drop resistance test or the like as described above. In this case, if the stoppers 16 are short, the gap between the second diaphragm 12b and the stoppers 16 is wide, and therefore the second diaphragm 12b undergoes a large amount of bending deformation before the deformation is stopped by coming into contact with the stoppers 16, and the second diaphragm 12b easily becomes damaged.

If the stoppers 16 are long as shown in FIG. 1C, the gap between the diaphragms 12a and 12b and the stoppers 16 is narrow when no deformation is occurring, and therefore deformation of the diaphragms 12a and 12b is suppressed by the stoppers 16. For this reason, even if a high pressure load is applied to the second diaphragm 12b, the second diaphragm 12b does not undergo a large amount of deformation, thus making it unlikely for the second diaphragm 12b to bend a large amount and become damaged. In contrast, if the stoppers 16 are long, the gap between the first diaphragm 12a and the stoppers 16 is narrow, and therefore there is a reduction in the amount of elastic restoration force generated when the first diaphragm 12a comes into contact with the stoppers 16, and the first diaphragm 12a does not easily detach from the stoppers 16, and is likely to become stuck.

SUMMARY

In a conventional stopper structure, there is a tradeoff relationship between the demand for higher sticking resistance and the demand for higher diaphragm damage resistance, and it has not been possible to satisfy both sticking resistance and damage resistance.

A capacitance-type transducer according to one or more embodiments of the present invention has multiple sensing portions and makes it possible to satisfy both demand for higher sticking resistance and demand for higher diaphragm damage resistance.

A capacitance-type transducer according to one or more embodiments of the present invention includes: a back plate having a fixed electrode; a diaphragm that opposes the back plate via an air gap and serves as a movable electrode; and at least first stoppers having a first projection length and second stoppers having a second projection length that project from at least one of a surface of the back plate on the air gap side and a surface of the diaphragm on the air gap side, wherein at least one of the diaphragm and the fixed electrode is divided into at least a first region having a first surface area and a second region having a second surface area, a first sensing portion made up of the diaphragm and the fixed electrode is constituted in the first region, and a second sensing portion made up of the diaphragm and the fixed electrode is constituted in the second region, and the first stoppers are provided on the first sensing portion, the second stoppers are provided on the second sensing portion, the first surface area of the first region is larger than the second surface area of the second region, and the projection length of the first stoppers is shorter than the projection length of the second stoppers.

According to the above capacitance-type transducer of one or more embodiments of the present invention, the surface area of the divided region constituting the first sensing portion, that is to say, the surface area of the first region, is larger than the surface area of the divided region constituting the second sensing portion, that is to say, the surface area of the second region, and the projection length of the first stoppers provided in the first sensing portion is shorter than the projection length of the second stoppers provided in the second sensing portion. Accordingly, in the first region that has a large surface area and in which the diaphragm tends to become stuck, the longest projection length of the first stoppers is comparatively short. For this reason, in this region, the diaphragm undergoes a large amount of displacement upon coming into contact with the first stoppers, and a large amount of elastic restoration force is generated, and thus the diaphragm does not easily become stuck to the first stoppers. Also, in the second region that has a small surface area and in which the diaphragm tends to become damaged, the longest projection length of the second stoppers is comparatively long. For this reason, in this region, even if a high load is applied to the diaphragm, displacement of diaphragm can be suppressed to a low amount by the second stoppers, and internal stress and stress concentration occurring in the diaphragm can be reduced, thus making it unlikely for the diaphragm to become damaged. As a result, it is possible to prevent sticking in the region in which the diaphragm easily becomes stuck, and it is possible to prevent damage to the diaphragm in the region in which the diaphragm easily becomes damaged, thus making it possible to manufacture a capacitance-type transducer that overall has excellent sticking resistance and damage resistance.

In a capacitance-type transducer according to one or more embodiments of the present invention, a region of the fixed electrode that opposes the diaphragm in the first sensing portion and a region of the fixed electrode that opposes the diaphragm in the second sensing portion constitute one flat surface.

In a capacitance-type transducer according to one or more embodiments of the present invention, a longest projection length among projection lengths of the second stoppers is longer than a longest projection length among projection lengths of the first stoppers.

In a capacitance-type transducer according to one or more embodiments of the present invention, a shortest projection length among projection lengths of the second stoppers is longer than a shortest projection length among projection lengths of the first stoppers.

In a capacitance-type transducer according to one or more embodiments of the present invention, in the first sensing portion, the first stoppers have a shorter projection length in a large displacement region of the diaphragm or a region that opposes the large displacement region, and the first stoppers have a longer projection length in a small displacement region of the diaphragm or a region that opposes the small displacement region.

Also, in one of the above embodiments, a plurality of stoppers including the first stoppers may protrude from the back plate in the first sensing portion, and in the first sensing portion, the projection lengths of the plurality of stoppers may be selected such that tips of the plurality of stoppers are aligned along a shape of the diaphragm in a deformed state of the diaphragm.

In a capacitance-type transducer according to one or more embodiments of the present invention, in the second sensing portion, the second stoppers have a shorter projection length in a large displacement region of the diaphragm or a region that opposes the large displacement region, and the second stoppers have a longer projection length in a small displacement region of the diaphragm or a region that opposes the small displacement region.

Also, in one of the above embodiments, a plurality of stoppers including the second stoppers may protrude from the back plate in the second sensing portion, and in the second sensing portion, the projection lengths of the plurality of stoppers may be selected such that tips of the plurality of stoppers are aligned along a shape of the diaphragm in a deformed state of the diaphragm.

In a capacitance-type transducer according to one or more embodiments of the present invention, the second stoppers are thicker than the first stoppers. If stoppers having a long projection length are provided, stress becomes concentrated in the portion of the diaphragm that comes into contact with the stoppers, but if the area of contact with the diaphragm is increased by making the stoppers in that region thicker, it is possible to disperse the stress over the contact surface.

In a capacitance-type transducer according to one or more embodiments of the present invention, the capacitance-type transducer includes a plurality of stoppers that include the first stoppers and the second stoppers, wherein a number density of stoppers in a vicinity of the second stoppers is greater than a number density of stoppers in a vicinity of the first stoppers. If stoppers having a long projection length are provided, stress becomes concentrated in the portion of the diaphragm that comes into contact with the stoppers, but if the area of contact with the diaphragm is increased by increasing the number density of the stoppers in that region, it is possible to disperse the stress over the contact surface.

In a capacitance-type transducer according to one or more embodiments of the present invention, the first stoppers and the second stoppers are manufactured using the same material as the back plate and in the same step as the back plate. Accordingly, the manufacturing of the stoppers is made easier, and there is no rise in the manufacturing cost of the stoppers.

A capacitance-type transducer according to one or more embodiments of the present invention can be used as an acoustic sensor by forming acoustic holes for allowing passage of acoustic vibration in the back plate. Also, an acoustic sensor according to one or more embodiments of the present invention can, along with a circuit portion, be used as a microphone.

Embodiments of the present invention may include combinations of the above-described constituent elements, and many variations are possible according to the combination of the constituent elements.

According to one or more embodiments of the present invention, in a capacitance-type transducer constituted by multiple sensing portions having different surface areas, even if a high load is applied to the diaphragms, the diaphragms are not likely to stick to the stoppers, and sticking resistance is improved. Furthermore, if a high load is applied to the diaphragms, it is possible to prevent a large amount of stress from becoming concentrated on the diaphragms, and it is possible to improve the damage resistance of the capacitance-type transducer.

BRIEF DESCRIPTION OF THE DRAWINGS

FIG. 20 is a schematic cross-sectional diagram showing a bottom-port microphone with an acoustic sensor according to one or more embodiments of the present invention built in.

DETAILED DESCRIPTION

The following describes embodiments of the present invention with reference to the accompanying drawings. Note that the present invention is not limited to the following embodiments, and various design modifications can be made within the scope of the present invention. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Embodiment 1

Figure 1A:
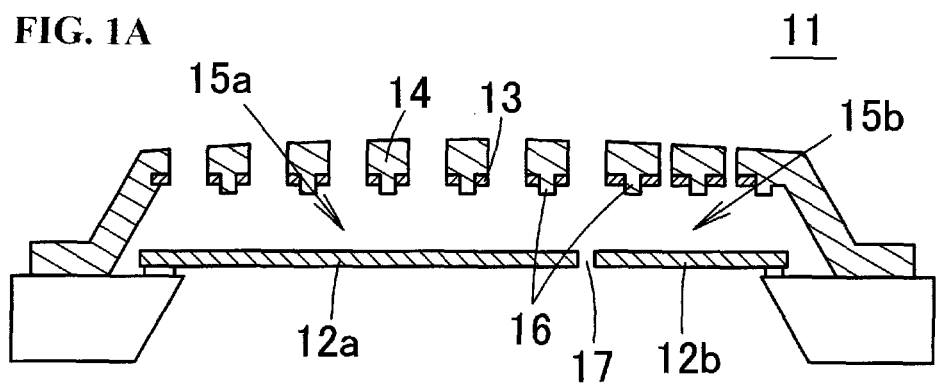
FIG. 1A is a schematic cross-sectional diagram of a conventional acoustic sensor.
Figure 1B:
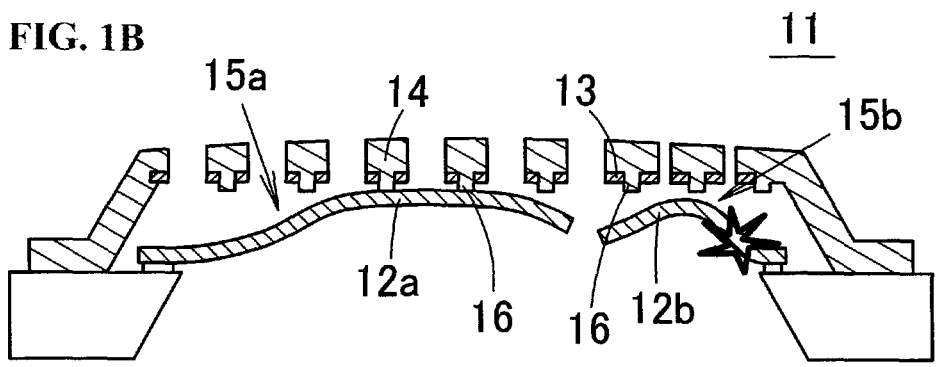
FIG. 1B is a schematic cross-sectional diagram illustrating an acoustic sensor in which the stoppers are short.
Figure 1C:
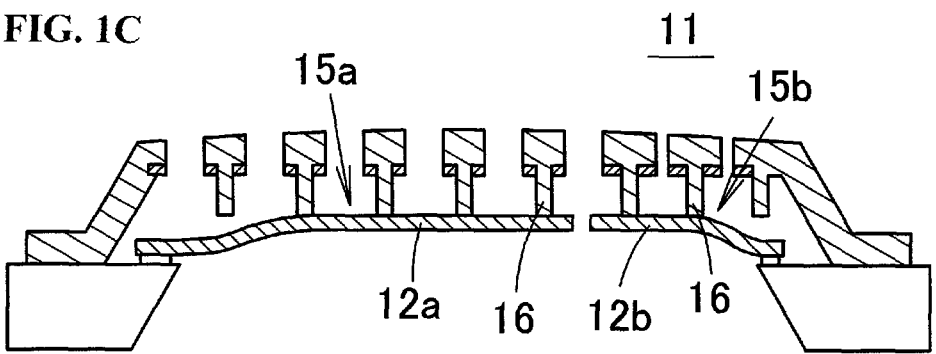
FIG. 1C is a schematic cross-sectional diagram illustrating an acoustic sensor in which the stoppers are long.
Figure 2:
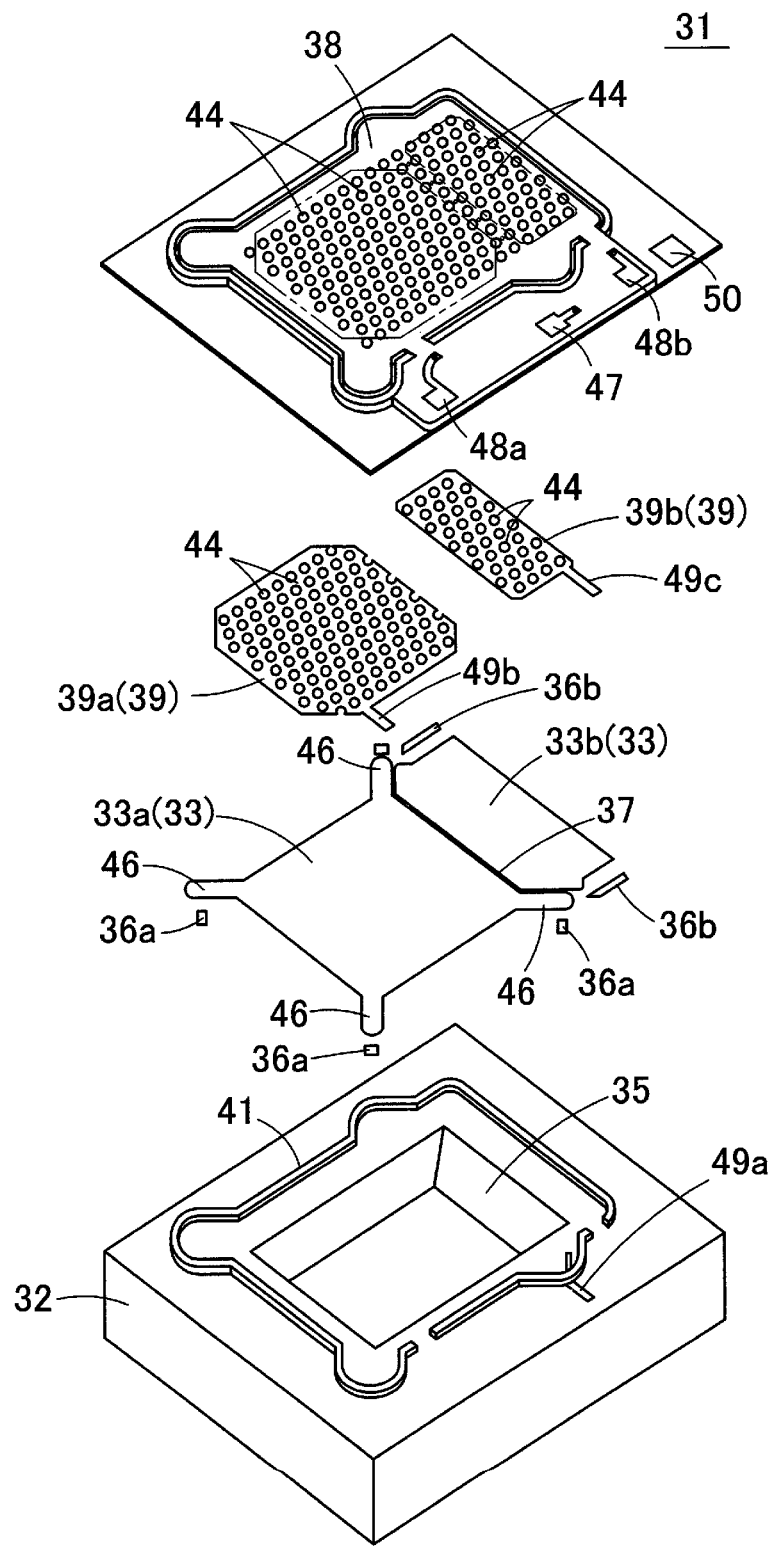
FIG. 2 is an exploded perspective view of an acoustic sensor according to Embodiment 1 of the present invention.
Figure 3:
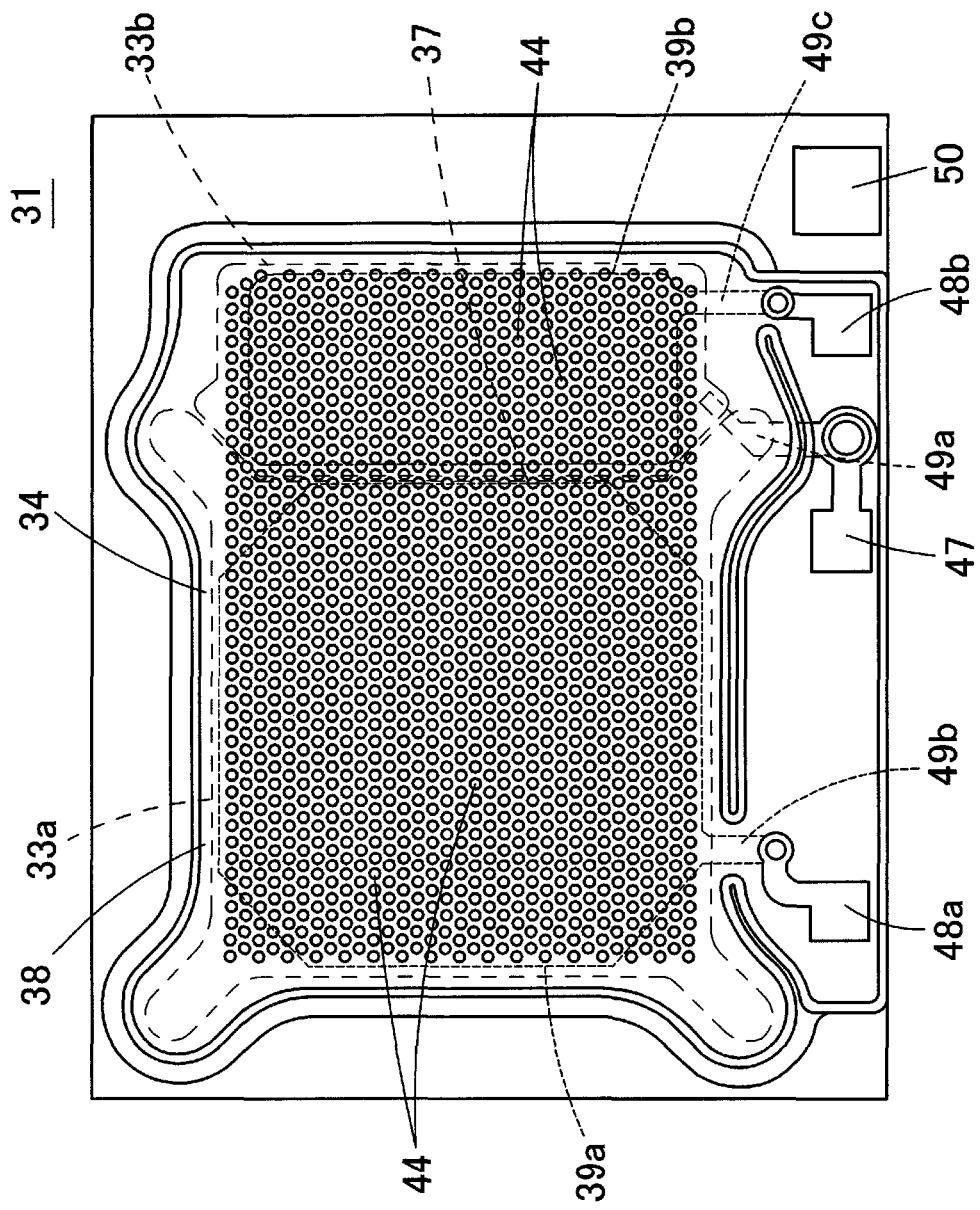
FIG. 3 is a plan view of the acoustic sensor shown in FIG. 2.
Figure 4:
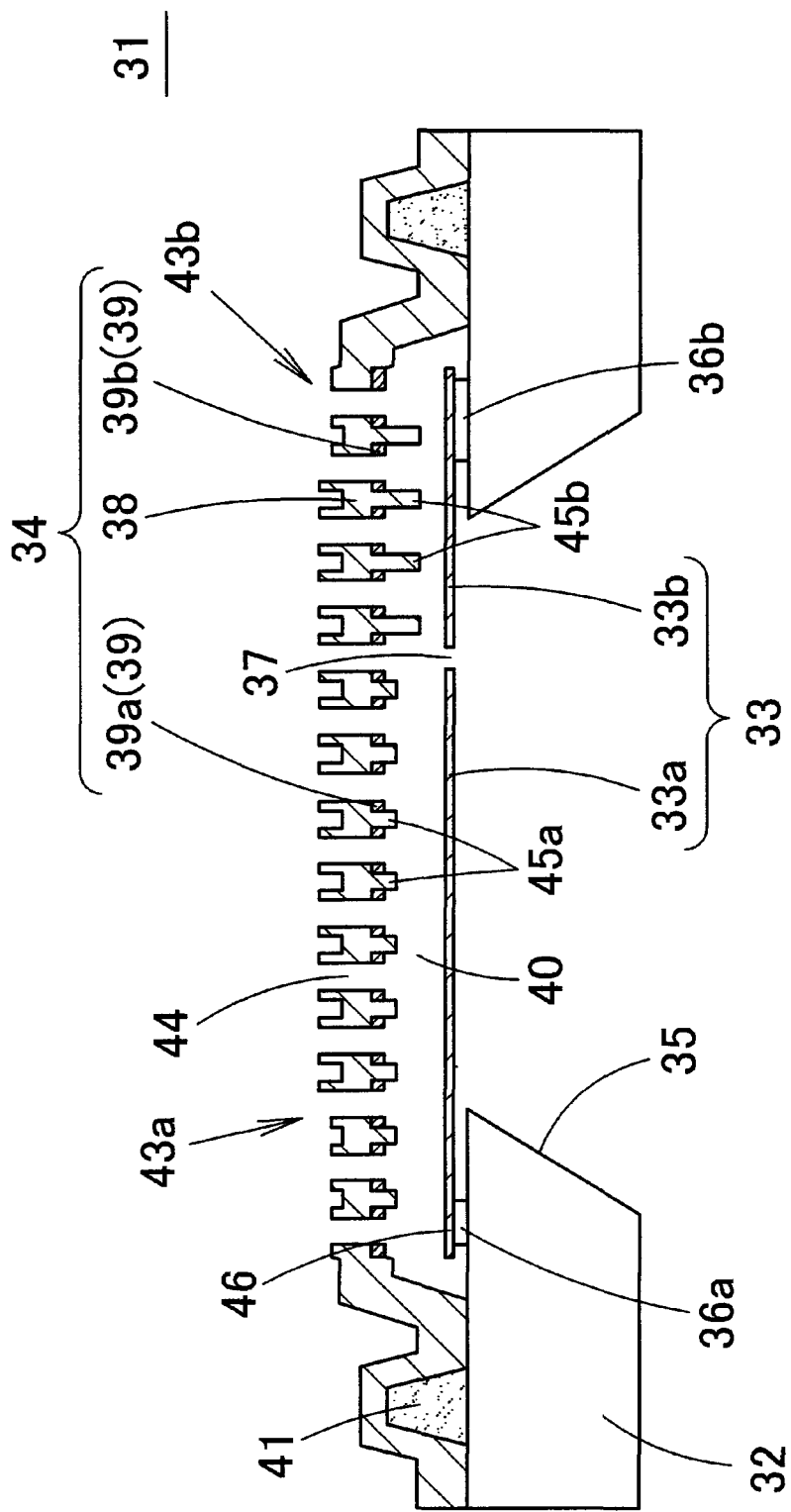
FIG. 4 is a schematic cross-sectional diagram of the acoustic sensor shown in FIG. 2.
Figure 5:
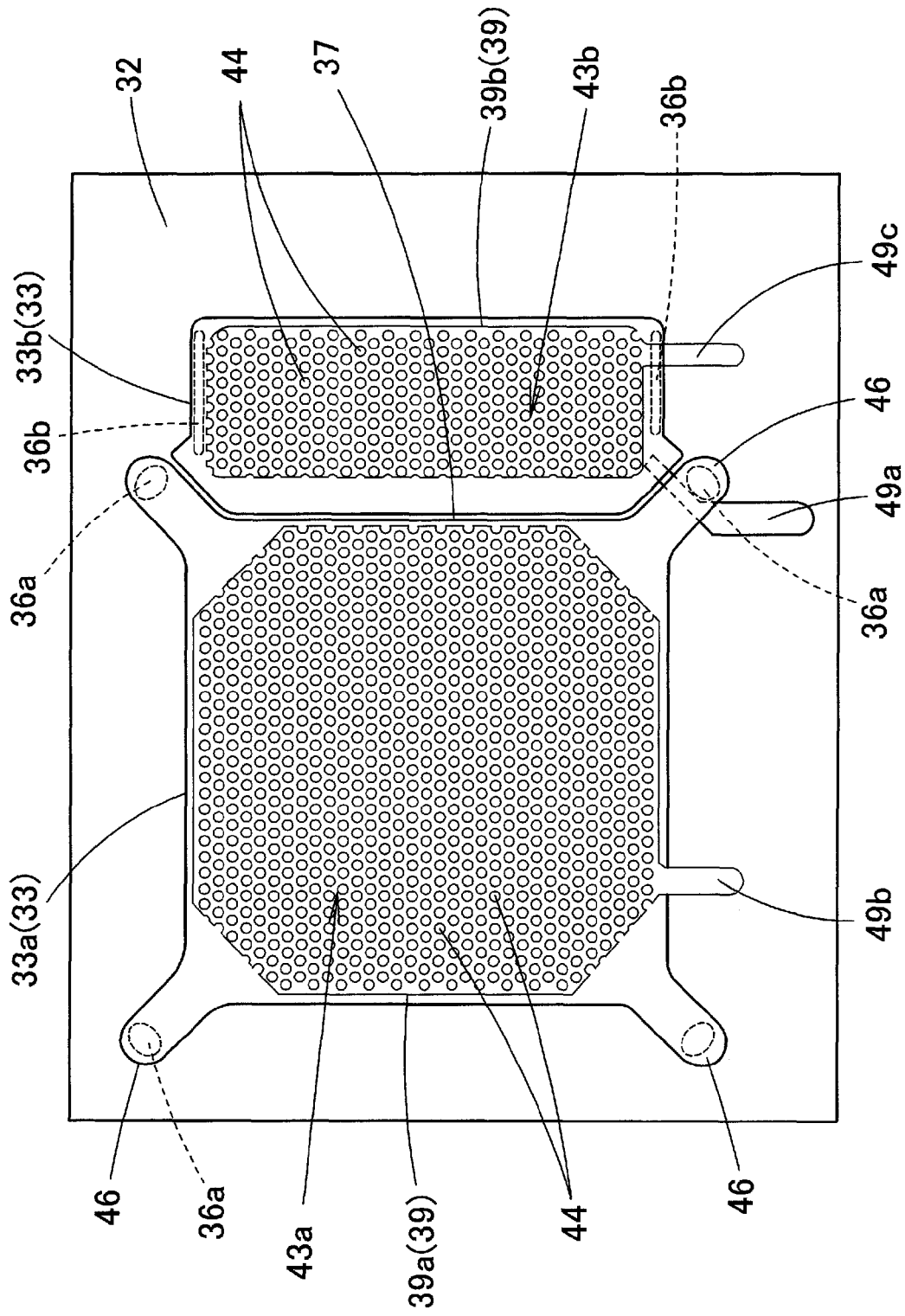
FIG. 5 is a plan view showing a state in which a back plate has been removed from the acoustic sensor shown in FIG. 3.

The following describes the structure of an acoustic sensor according to Embodiment 1 of the present invention with reference to FIGS. 2 to 5. FIG. 2 is an exploded perspective view showing a capacitance-type transducer according to Embodiment 1 of the present invention, that is to say an acoustic sensor 31. FIG. 3 is a plan view of the acoustic sensor 31. FIG. 4 is a schematic cross-sectional diagram of the acoustic sensor 31. FIG. 5 is a plan view of the acoustic sensor 31 from which a back plate 38 has been removed, and shows a state in which a diaphragm 33 (movable electrode plate) and a fixed electrode plate 39 (fixed electrode) are overlapped with each other above a substrate 32.

The acoustic sensor 31 is a capacitance type of device created using MEMS technology. As shown in FIGS. 2 and 4, in the acoustic sensor 31, the diaphragm 33 is provided on the upper surface of a substrate 32, which is made of a silicon substrate or the like, via anchors 36a and 36b, a canopy portion 34 is arranged above the diaphragm 33 via a very small air gap 40, and the canopy portion 34 is fixed to the upper surface of the substrate 32.

A cavity 35 (front chamber, back chamber) is formed in the substrate 32 so as to pass from the upper surface to the lower surface. Although the cavity 35 illustrated here is defined by wall surfaces that are inclined relative to the upper surface of the substrate 32, it may be surrounded by wall surfaces that are perpendicular to the upper surface of the substrate 32.

The diaphragm 33 is arranged above the substrate 32 so as to cover the cavity 35. As shown in FIGS. 2 and 5, the diaphragm 33 is formed in a substantially rectangular shape. The diaphragm 33 is formed by a conductive polysilicon thin film, and the diaphragm 33 itself serves as a movable electrode. The diaphragm 33 is divided into a first diaphragm 33a and a second diaphragm 33b by a slit 37 that extends in a direction parallel to a short side of the diaphragm 33. The first diaphragm 33a and the second diaphragm 33b are both substantially rectangular, and the first diaphragm 33a has a larger surface area than the second diaphragm 33b.

Leg pieces 46 provided in corner portions of the first diaphragm 33a are supported on the upper surface of the substrate 32 by anchors 36a, and thus the first diaphragm 33a floats above the upper surface of the substrate 32. The two short sides of the second diaphragm 33b are supported on the upper surface of the substrate 32 by anchors 36b, and thus the second diaphragm 33b is supported so as to float above the upper surface of the substrate 32.

A lead-out interconnect 49a provided on the upper surface of the substrate 32 is connected to the diaphragm 33. Furthermore, a strip-shaped base portion 41 is formed on the upper surface of the substrate 32 so as to surround the diaphragm 33. The anchors 36a and 36b and the base portion 41 are formed by $SiO_2$.

As shown in FIG. 4, the canopy portion 34 is obtained by providing the fixed electrode plate 39, which is made of a conductive polysilicon thin film, on the lower surface of the back plate 38, which is made of SiN. The canopy portion 34 is shaped as a dome and has a cavity portion on its underside, and the diaphragm 33 is covered by the cavity portion. A very small air gap 40 is formed between the lower surface of the fixed electrode plate 39 and the upper surface of the diaphragm 33.

The fixed electrode plate 39 is divided into a first fixed electrode plate 39a that opposes the first diaphragm 33a and a second fixed electrode plate 39b that opposes the second diaphragm 33b, and the fixed electrode plates 39a and 39b are electrically separated from each other. The first fixed electrode plate 39a has a larger surface area than the second fixed electrode plate 39b. A lead-out interconnect 49b extends from the first fixed electrode plate 39a, and a lead-out interconnect 49c extends from the second fixed electrode plate 39b.

A first acoustic sensing portion 43a having a capacitor structure is formed by the first diaphragm 33a and the first fixed electrode plate 39a that oppose each other across the air gap 40. Also, a second acoustic sensing portion 43b having a capacitor structure is formed by the second diaphragm 33b and the second fixed electrode plate 39b that oppose each other across the air gap 40. The gap distance between the first diaphragm 33a and the first fixed electrode plate 39a in the first acoustic sensing portion 43a is the same as the gap distance between the second diaphragm 33b and the second fixed electrode plate 39b in the second acoustic sensing portion 43b.

A large number of acoustic holes 44 for allowing acoustic vibration to pass are formed in the back plate 38 and the fixed electrode plate 39 so as to pass from the upper surface to the lower surface. As shown in FIGS. 3 and 5, the acoustic holes 44 are in a regular arrangement in both of the two acoustic sensing portions 43a and 43b. The acoustic holes 44 are arranged in a triangular shape along three directions that form 120° angles with each other in the illustrated example, but they may be arranged in a rectangular shape, concentric circles, or the like.

As shown in FIG. 4, in the first acoustic sensing portion 43a, a large number of very small stoppers 45a shaped as circular columns project from the lower surface of the canopy portion 34. In the second acoustic sensing portion 43b as well, a large number of very small stoppers 45b shaped as circular columns project from the lower surface of the canopy portion 34. The stoppers 45a and 45b integrally project from the lower surface of the back plate 38, and pass through the first and second fixed electrode plates 39a and 39b. The stoppers 45a and 45b are insulating due to being made of SiN likewise to the back plate 38. The stoppers 45a and 45b are for preventing the diaphragms 33a and 33b from adhering to and not separating from the fixed electrode plates 39a and 39b.

The stoppers 45a that oppose the first diaphragm 33a all have the same projection length. Also, the stoppers 45b that oppose the second diaphragm 33b all also have the same projection length, but the projection length of the stoppers 45b is longer than that of the stoppers 45a. Also, in one or more embodiments of the present invention, the stoppers 45a that oppose the first diaphragm 33a and the stoppers 45b that oppose the second diaphragm 33b have the same thickness and are arranged with the same density (or the same pitch).

The outer peripheral edge of the canopy-shaped back plate 38 extends over the upper surface of the substrate 32, and the base portion 41 is covered by the back plate 38.

A common electrode pad 47, a first electrode pad 48a, a second electrode pad 48b, and a grounding electrode pad 50 are provided on the upper surface of the outer peripheral portion of the back plate 38. The other end of the lead-out interconnect 49a connected to the diaphragm 33 is connected to the common electrode pad 47. The lead-out interconnect 49b extending from the first fixed electrode plate 39a is connected to the first electrode pad 48a, and the lead-out interconnect 49c extending from the second fixed electrode plate 39b is connected to the second electrode pad 48b. Also, the grounding electrode pad 50 is connected to the substrate 32 and held at ground potential.

In the acoustic sensor 31 having the above-described structure, a low-volume high-sensitivity sensing portion is configured by the first acoustic sensing portion 43a having a large surface area, and a high-volume low-sensitivity sensing portion is configured by the second acoustic sensing portion 43b having a small surface area, and therefore if the output of the acoustic sensor 31 is switched between output from the first acoustic sensing portion 43a and output from the second acoustic sensing portion 43b in accordance with the volume, it is possible to widen the dynamic range of the acoustic sensor 31. Moreover, the first diaphragm 33a and the second diaphragm 33b are formed by dividing a diaphragm, and thus are formed at the same time, and the first fixed electrode plate 39a and the second fixed electrode plate 39b are formed by dividing a fixed electrode plate, and thus are formed at the same time, thus making it possible to reduce variation in the detection sensitivity and characteristics of the first acoustic sensing portion 43a and the second acoustic sensing portion 43b.

Figure 6:
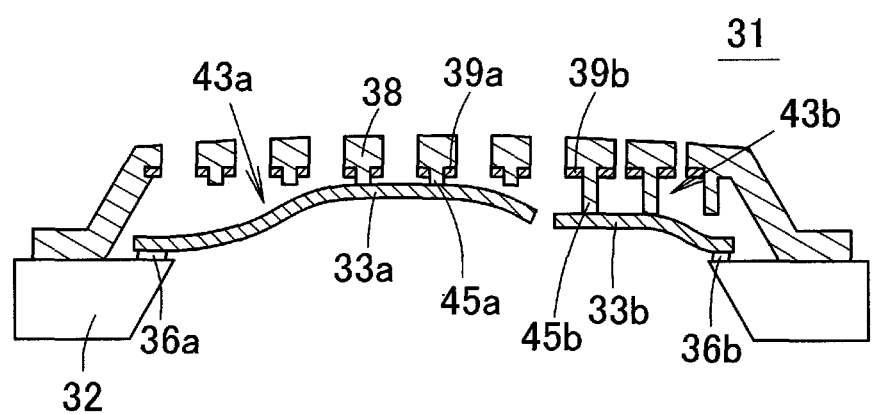
FIG. 6 is a diagram for describing an effect of the acoustic sensor according to Embodiment 1.

Furthermore, since the projection length of the stoppers 45a in the first acoustic sensing portion 43a is short in the acoustic sensor 31, the gap between the first diaphragm 33a and the stoppers 45a is wide when no deformation is occurring, as shown in FIG. 6. For this reason, when the first diaphragm 33a is in contact with the stoppers 45a, the first diaphragm 33a is undergoing a large amount of deformation. As a result, a large amount of elastic restoration force is generated when the first diaphragm 33a comes into contact with the stoppers 45a, and the first diaphragm 33a easily detaches from the stoppers 45a. In other words, the first diaphragm 33a is not likely to become stuck to the stoppers 45a, and the sticking resistance of the acoustic sensor 31 is improved.

On the other hand, since the projection length of the stoppers 45b is long in the second acoustic sensing portion 43b, the gap between the second diaphragm 33b and the stoppers 45b is narrow when no deformation is occurring, as shown in FIG. 6. For this reason, if a high pressure load is applied to the second diaphragm 33b due to excessive sound pressure being applied or a drop resistance test being performed, the displacement of the second diaphragm 33b is suppressed by the stoppers 45b. As a result, even if a high pressure load is applied to the second diaphragm 33b, the second diaphragm 33b is not likely to become damaged, and the damage resistance of the acoustic sensor 31 is improved.

In this way, according to the acoustic sensor 31, it is possible to improve sticking resistance and damage resistance, and both resistances can be achieved at the same time.

Figures 7A, 7B:
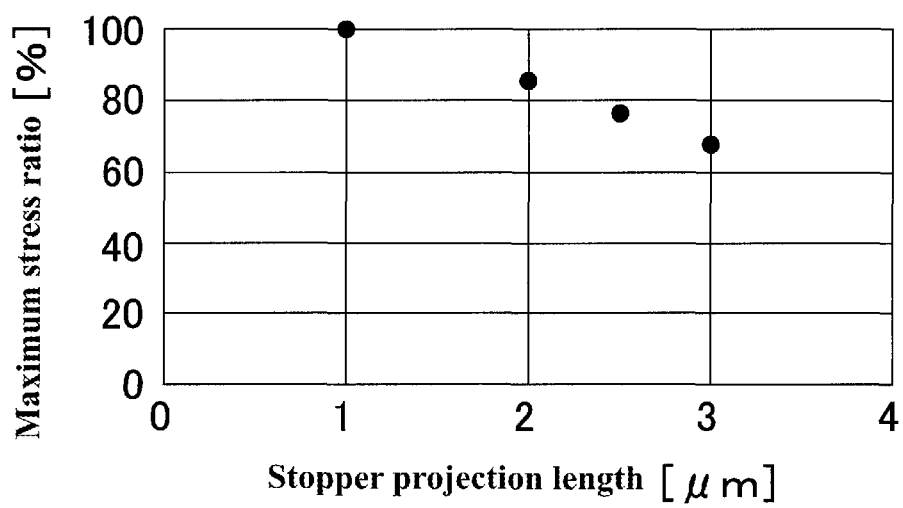
FIG. 7A is a diagram showing change in the maximum stress (ratio) occurring in the second diaphragm according to different stopper projection lengths in a second acoustic sensing portion.
FIG. 7B is a graph representation of the maximum stress ratios shown in FIG. 7A.

A simulation was performed to obtain the maximum stress occurring in the second diaphragm 33b when 20 kPa pressure is applied to the second diaphragm 33b. In the simulation model, the gap distance between the diaphragm 33a and the fixed electrode plate 39a and between the diaphragm 33b and the fixed electrode plate 39b was 3.7 μm, the projection length of the stoppers 45a was 1.0 μm, and the projection length of the stoppers 45b was 1.0 μm, 2.0 μm, 2.5 μm, or 3.0 μm. FIG. 7A shows the results of the simulation, that is to say the maximum stress occurring in the second diaphragm 33b (displacement amount when the second diaphragm 33b came into contact with the stoppers 45b) in the cases where the projection length of the stoppers 45b was set to 1.0 μm, 2.0 μm, 2.5

μm, and 3.0 μm. Note that the maximum stress indicates the percentage of the maximum stress relative to the stress when the projection length of the stoppers 45b is 1.0 μm, which is assumed to be the maximum stress of 100%. Also, FIG. 7B is a graph representation of the relationship between the ratio of maximum stress occurring in the second diaphragm 33b and the projection length of the stoppers 45b.

As shown in FIGS. 7A and 7B, when the projection lengths of the stoppers 45b were 2 times, 2.5 times, and 3 times the projection length of the stoppers 45a (1 μm), the displacement amount of the second diaphragm 33b gradually decreased, and the ratio of maximum stress occurring in the second diaphragm 33b gradually decreased to 85.3%, 76.3%, and 67.9%, and therefore it can be understood that the second diaphragm 33b was not likely to become damaged.

Also, in actual measurement results as well, when the projection length of the stoppers 45b was set to approximately two times (1.9 μm) and approximately three times (2.8 μm) the projection length of the stoppers 45a (1.0 μm), the pressure capacity of the stoppers 45b was improved to approximately 1.1 times and 1.3 times the case where the projection lengths of the stoppers 45b were 1.0 μm likewise to the stoppers 45a. Moreover, even when the projection length of the stoppers 45b was increased, the stoppers 45b did not become stuck to the second diaphragm 33b. Accordingly, improvement in sticking resistance and improvement in damage resistance were confirmed by actual measurement as well.

Manufacturing Method of Embodiment 1

Next, a method for manufacturing the acoustic sensor 31 of Embodiment 1 will be described with reference to FIGS. 8A to 8D and FIGS. 9A to 9C. FIGS. 8A to 8D and FIGS. 9A to 9C all show enlargements of a portion of the acoustic sensor during respective manufacturing steps.

Figure 8A:
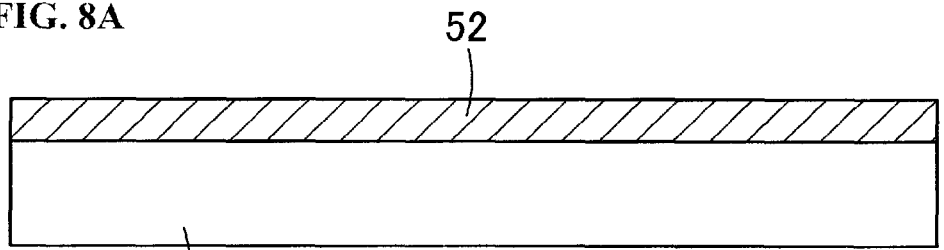
FIGS. 8A to 8D are cross-sectional diagrams showing acoustic sensor manufacturing steps according to Embodiment 1.
Figure 8B:
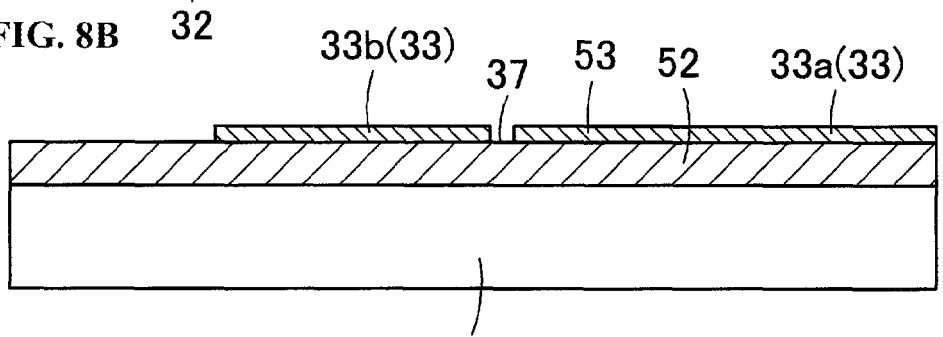

First, as shown in FIG. 8A, an oxide film 52 (SiO$_2$) is deposited on the entirety of the upper surface of the substrate 32 (Si substrate). Next, as shown in FIG. 8B, a polysilicon film 53 is deposited on the oxide film 52, and the polysilicon film 53 is etched to form the diaphragms 33a and 33b on the upper surface of the oxide film 52. At this time, the first diaphragm 33a and the second diaphragm 33b are separated by the slit 37. Steps for forming and then removing the mask for etching will not be described here, and the same follows below.

Figure 8C:
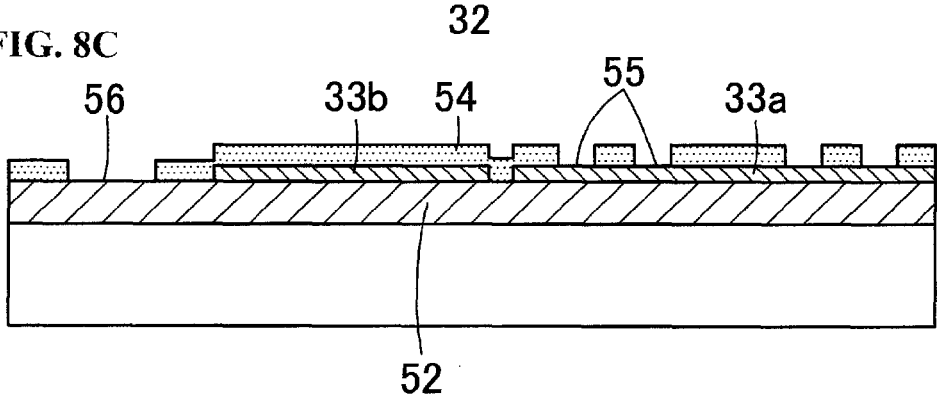

As shown in FIG. 8C, a first sacrifice layer 54 made of a Si oxide film is deposited on the entirety of the upper surface of the oxide film 52 and the diaphragms 33a and 33b. Next, the first sacrifice layer 54 is etched until the first diaphragm 33a is exposed at the positions where the short stoppers 45a are to be provided, thus providing recesses 55 in the first sacrifice layer 54. When the recesses 55 are provided, the first diaphragm 33a acts as the etching stop layer, and therefore the depth of the recesses 55 is determined by the film thickness of the first sacrifice layer 54. At the same time, the first sacrifice layer 54 is etched until the oxide film 52 is exposed along the region surrounding the diaphragms 33a and 33b (the region of the back plate 38 adjacent to the substrate 32), thus forming a comparatively wide annular opening 56 in the first sacrifice layer 54.

Figure 8D:
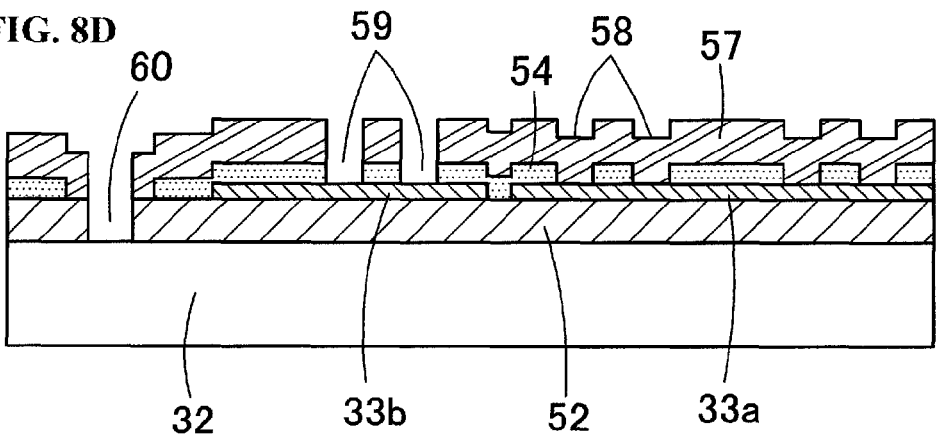

As shown in FIG. 8D, a second sacrifice layer 57 made of a Si oxide film is deposited on the first sacrifice layer 54. At this time, recessed portions 58 are formed in the second sacrifice layer 57 at the positions where the recesses 55 were provided. The second sacrifice layer 57 and the first sacrifice layer 54 are etched until the second diaphragm 33b is exposed at the locations where the long stoppers 45b are to be provided above the second diaphragm 33b, thus forming through-holes 59 in the second sacrifice layer 57 and the first sacrifice layer 54. When the through-holes 59 are formed, the second diaphragm 33b acts as the etching stop layer, and therefore the depth of the through-holes 59 is determined by the sum of the film thicknesses of the first sacrifice layer 54 and the second sacrifice layer 57. Also, the second sacrifice layer 57 and the oxide film 52 are etched until the substrate 32 is exposed in the region where the opening 56 was provided, thus forming a groove 60 that is narrower than the opening 56 in the second sacrifice layer 57 and the oxide film 52.

Figure 9A:
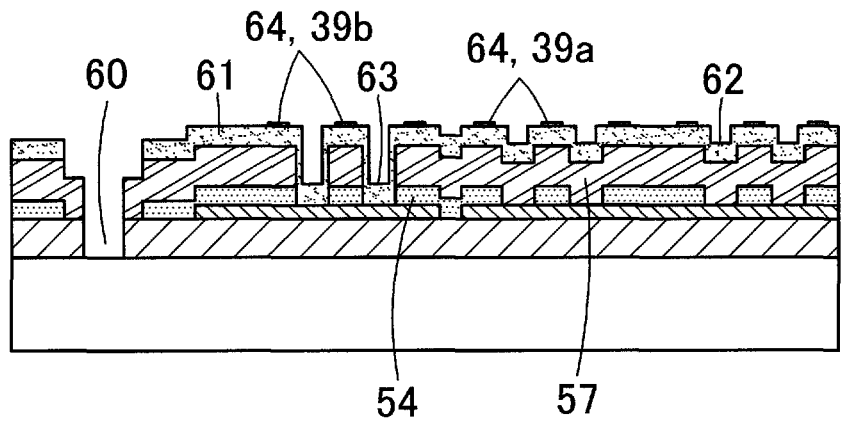
FIGS. 9A to 9C are continuations from FIG. 8D.

Next, as shown in FIG. 9A, a third sacrifice layer 61 made of a Si oxide film is deposited on the second sacrifice layer 57, and the third sacrifice layer 61 is etched to remove the portion of the third sacrifice layer 61 deposited inside the groove 60. At this time, recessed portions 62 appear in the third sacrifice layer 61 at the locations where the recessed portions 58 were provided, and recessed portions 63 appear in the third sacrifice layer 61 at the locations where the through-holes 59 were provided. A polysilicon film 64 is then deposited on the upper surface of the third sacrifice layer 61, and the polysilicon film 64 is patterned by etching to form the fixed electrode plates 39a and 39b.

Figure 9B:
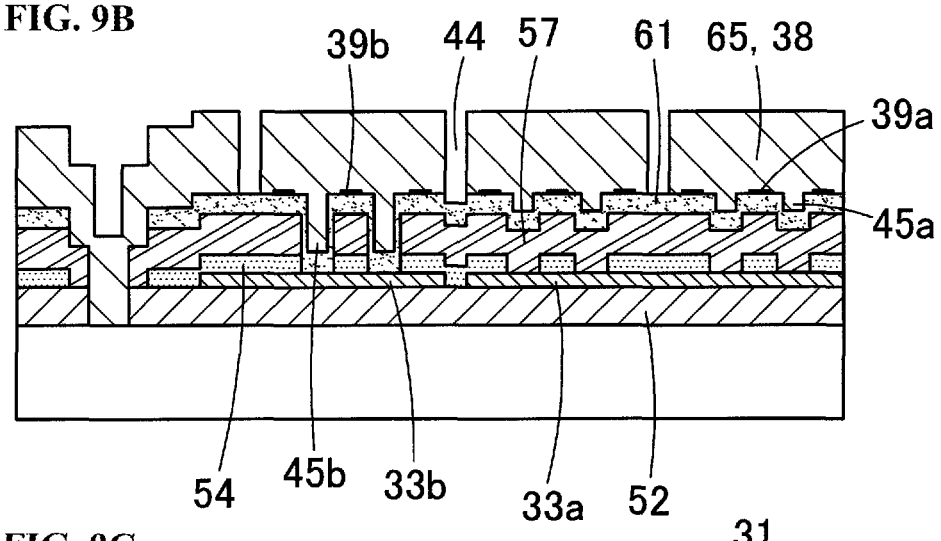

As shown in FIG. 9B, a silicon nitride film 65 is deposited on the third sacrifice layer 61 and the fixed electrode plates 39a and 39b to form the back plate 38. At this time, the short stoppers 45a are formed on the lower surface of the back plate 38 by the silicon nitride film 65 deposited inside the recessed portions 62, and the long stoppers 45b are formed on the lower surface of the back plate 38 by the silicon nitride film 65 deposited inside the recessed portions 63. Also, a back plate 38 support portion is formed by the deposition of the silicon nitride film 65 in the groove 60. The back plate 38 is then etched to form a large number of acoustic holes 44 in the back plate 38.

Figure 9C:
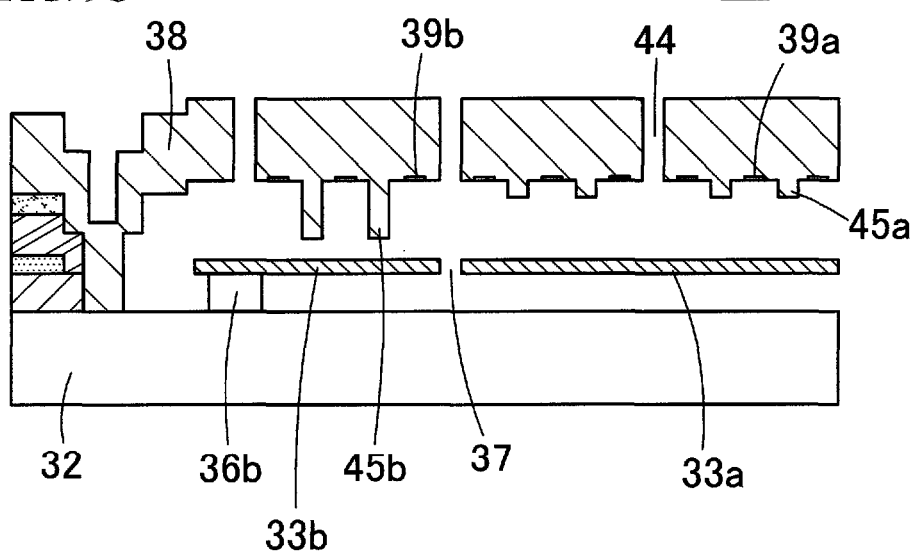

Subsequently, as shown in FIG. 9C, an etchant is introduced to the underside of the back plate 38 through the acoustic holes 44 to remove the third sacrifice layer 61, the second sacrifice layer 57, and the first sacrifice layer 54, thus forming the void portion between the back plate 38 and the substrate 32. Note that the etching is stopped so as to leave portions of the oxide film 52 below the diaphragms 33a and 33b, and the anchors 36a and 36b are formed by these remaining portions of the oxide film 52. Although not shown, the cavity 35 is provided in the substrate 32 by etching the substrate 32 from therebelow, thus completing the acoustic sensor 31.

According to the manufacturing method described above, it is possible to manufacture the acoustic sensor 31 that includes multiple types of stoppers having different projection lengths, without increasing the number of steps for manufacturing the acoustic sensor 31. Moreover, the projection length of the short stoppers 45a is determined by the film thickness of the first sacrifice layer 54, and the projection length of the long stoppers 45b is determined by the sum of the film thicknesses of the first sacrifice layer 54 and the second sacrifice layer 57, thus facilitating the design as well.

Variations

Figure 10:
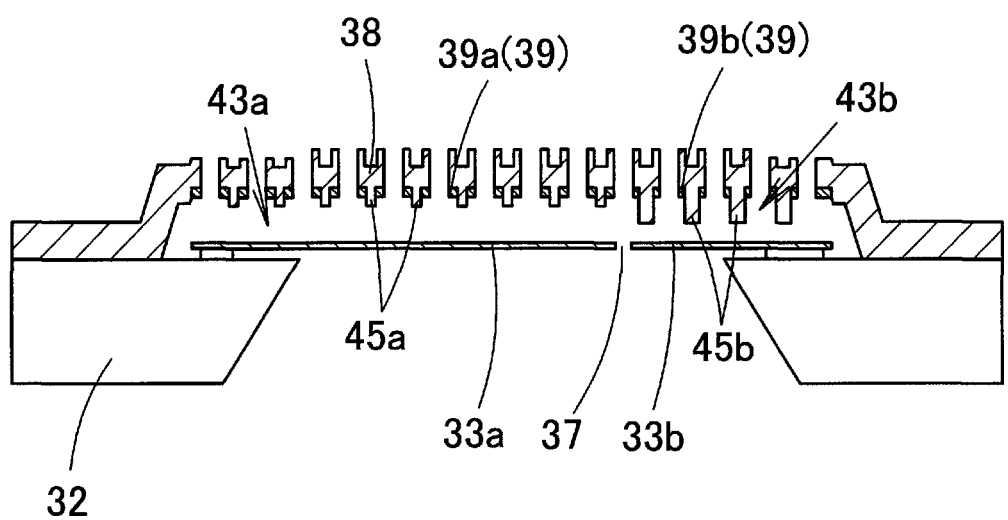
FIG. 10 is a schematic cross-sectional diagram showing a variation of Embodiment 1 of the present invention.

FIG. 10 is a schematic cross-sectional diagram showing a variation of the acoustic sensor of Embodiment 1. In this variation, the thickness (diameter) of the stoppers 45b is larger than the thickness of the stoppers 45a. If the stoppers 45b having a long projection length are provided, stress becomes concentrated in the portion of the second diaphragm 33b that comes into contact with the stoppers 45b, and therefore it is desirable to increase the area of contact by increasing the diameter of the stoppers 45b, thus dispersing the stress over the contact surface.

Figure 11:
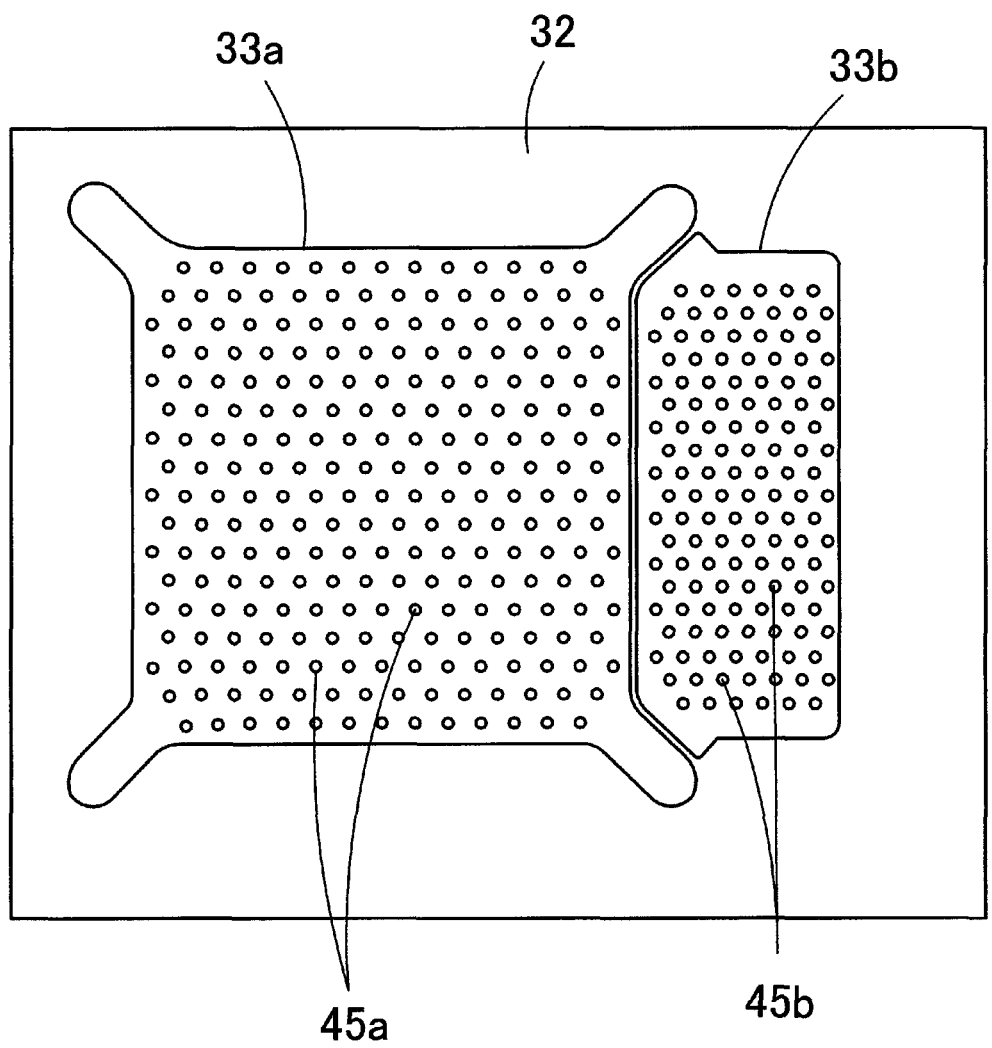
FIG. 11 is a plan view illustrating another variation of Embodiment 1 of the present invention.

FIG. 11 is a plan view illustrating another variation of the acoustic sensor of Embodiment 1. FIG. 11 shows the first diaphragm 33a and the second diaphragm 33b, and the positions of the stoppers 45a and 45b provided respectively opposing the two diaphragms 33a and 33b. In this variation, the number density of the stoppers 45b provided opposing the second diaphragm 33b is greater than the number density of the stoppers 45a provided opposing the first diaphragm 33a. For example, the pitch of the stoppers 45b is set narrower than the pitch of the stoppers 45a. If the stoppers 45b having a long projection length are provided, stress becomes concentrated in the portion of the second diaphragm 33b that comes into contact with the stoppers 45b, and therefore by increasing the number density of the stoppers 45b (or reducing the pitch of the stoppers 45b) to increase the area of contact, it is possible to disperse the stress over the contact surface.

Embodiment 2

Figure 12:
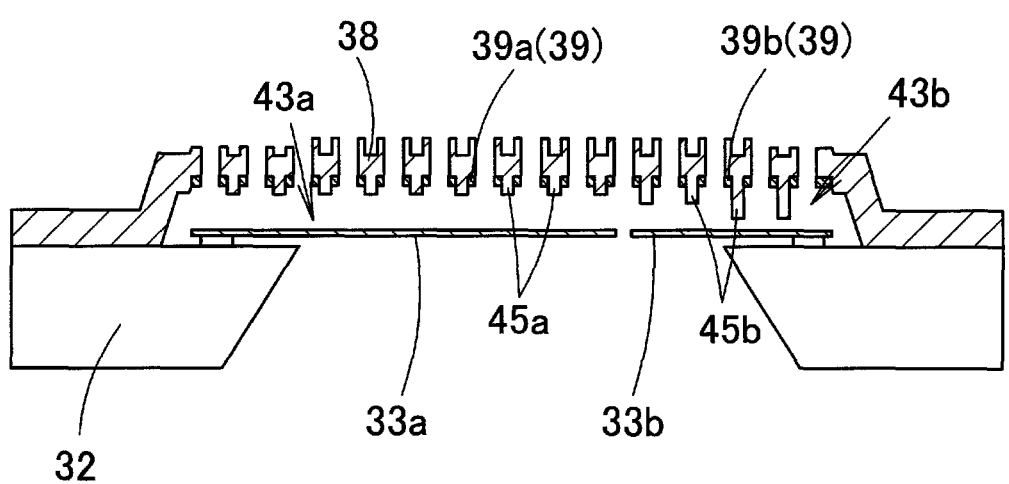
FIG. 12 is a schematic cross-sectional diagram showing an acoustic sensor according to Embodiment 2 of the present invention.

FIG. 12 is a schematic cross-sectional diagram showing an acoustic sensor 71 according to Embodiment 2 of the present invention. In the acoustic sensor 71, the second acoustic sensing portion 43b is provided with stoppers 45b having a longer projection length than the stoppers 45a in the first acoustic sensing portion 43a, and more specifically, the second acoustic sensing portion 43b is provided with two types of stoppers 45b having different projection lengths, namely comparatively short stoppers 45b and comparatively long stoppers 45b. The comparatively short stoppers 45b are provided in the region that opposes the region of the second diaphragm 33b that undergoes large displacement, and the comparatively long stoppers 45b are provided in the region that opposes the region of the second diaphragm 33b that undergoes small displacement (e.g., the vicinity of the portion fixed by the anchor 36b).

Figure 13A:
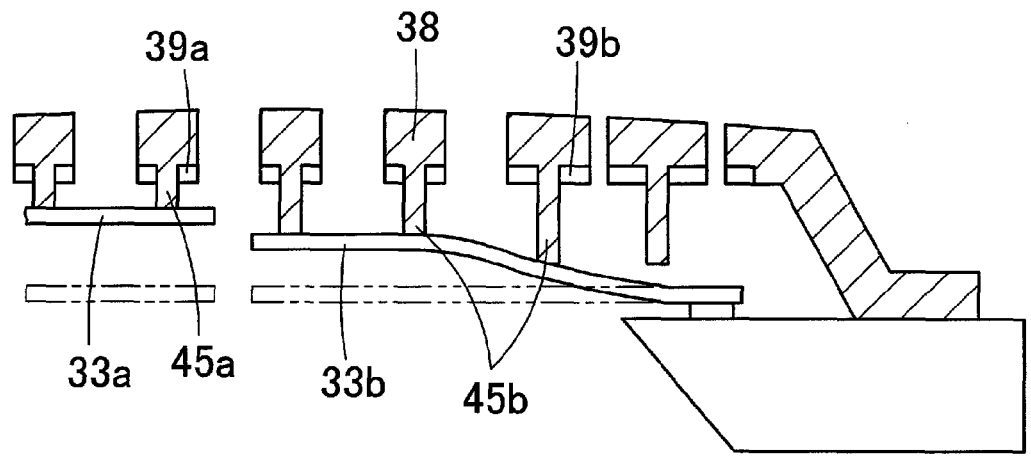
FIGS. 13A and 13B are schematic diagrams for describing an effect of the acoustic sensor according to Embodiment 2.
Figure 13B:
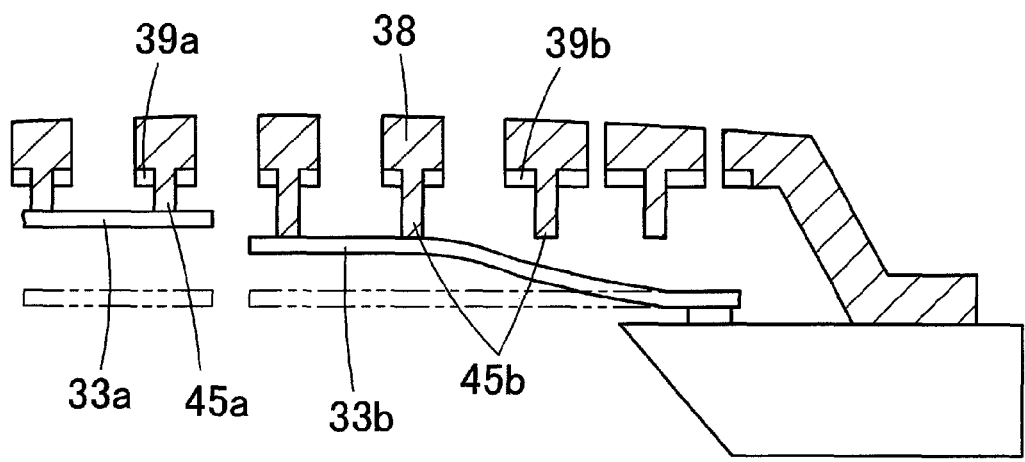

FIG. 13B shows the case where stoppers 45b having a uniform length are provided in the second acoustic sensing portion 43b. In the case where stoppers 45b having a uniform length are provided, as shown in FIG. 13B, even when the second diaphragm 33b is subjected to pressure and undergoes deformation, the small displacement region of the second diaphragm 33b is not likely to come into contact with the stoppers 45b. However, if the second diaphragm 33b is subjected to an excessive pressure load, the second diaphragm 33b undergoes a large amount of deformation in the region that undergoes less displacement than the large displacement region, and stress is likely to become concentrated in the second diaphragm 33b. For this reason, if the projection length of the stoppers 45b is constant, as the stoppers 45b are subjected to excessive pressure and repeatedly undergo deformation, there is the risk of cracking and damage occurring in the small displacement region of the second diaphragm 33b.

In contrast, by setting a longer projection length for the stoppers 45b in the small displacement region of the second diaphragm 33b, when the second diaphragm 33b undergoes large displacement, the small displacement region of the second diaphragm 33b also comes into contact with the stoppers 45b as shown in FIG. 13A, thus suppressing the deformation of the small displacement region of the second diaphragm 33b. As a result, it is possible to improve the damage resistance of the second diaphragm 33b. Note that if the projection length of the stoppers 45b is lengthened in the entirety of the region that opposes the second diaphragm 33b, the second diaphragm 33b is less likely to undergo displacement due to pressure, and the sensitivity of the acoustic sensor 71 decreases, but if the projection length of the stoppers 45b is shortened in the large displacement region of the second diaphragm 33b, displacement of the second diaphragm 33b due to pressure is not likely to be hindered, and the sensitivity of the acoustic sensor 71 is not likely to decrease.

Note that the first acoustic sensing portion 43a may be provided with two types of stoppers 45a having different projection lengths, namely comparatively short stoppers 45a and comparatively long stoppers 45a.

Embodiment 3

Figure 14A:
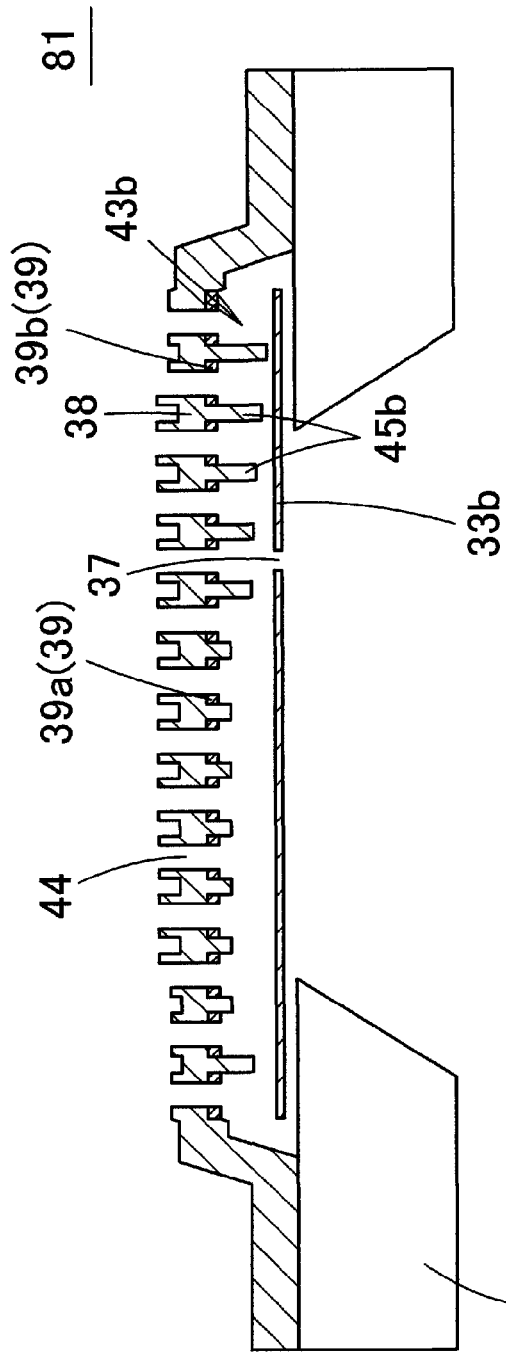
FIGS. 14A and 14B are schematic cross-sectional diagrams showing an acoustic sensor according to Embodiment 3 of the present invention.
Figure 14B:
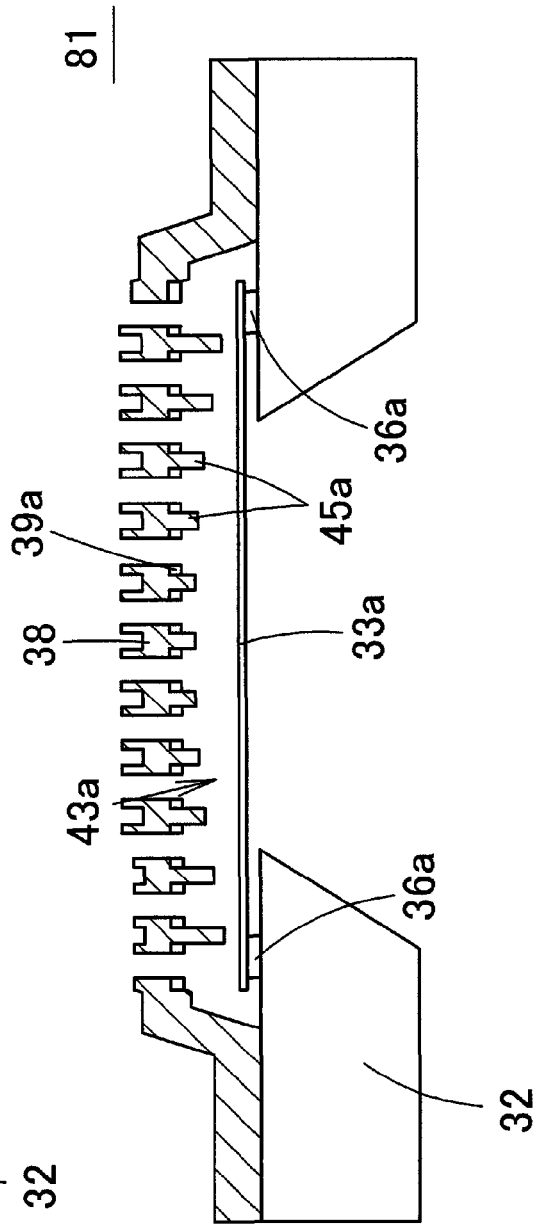
Figure 15:
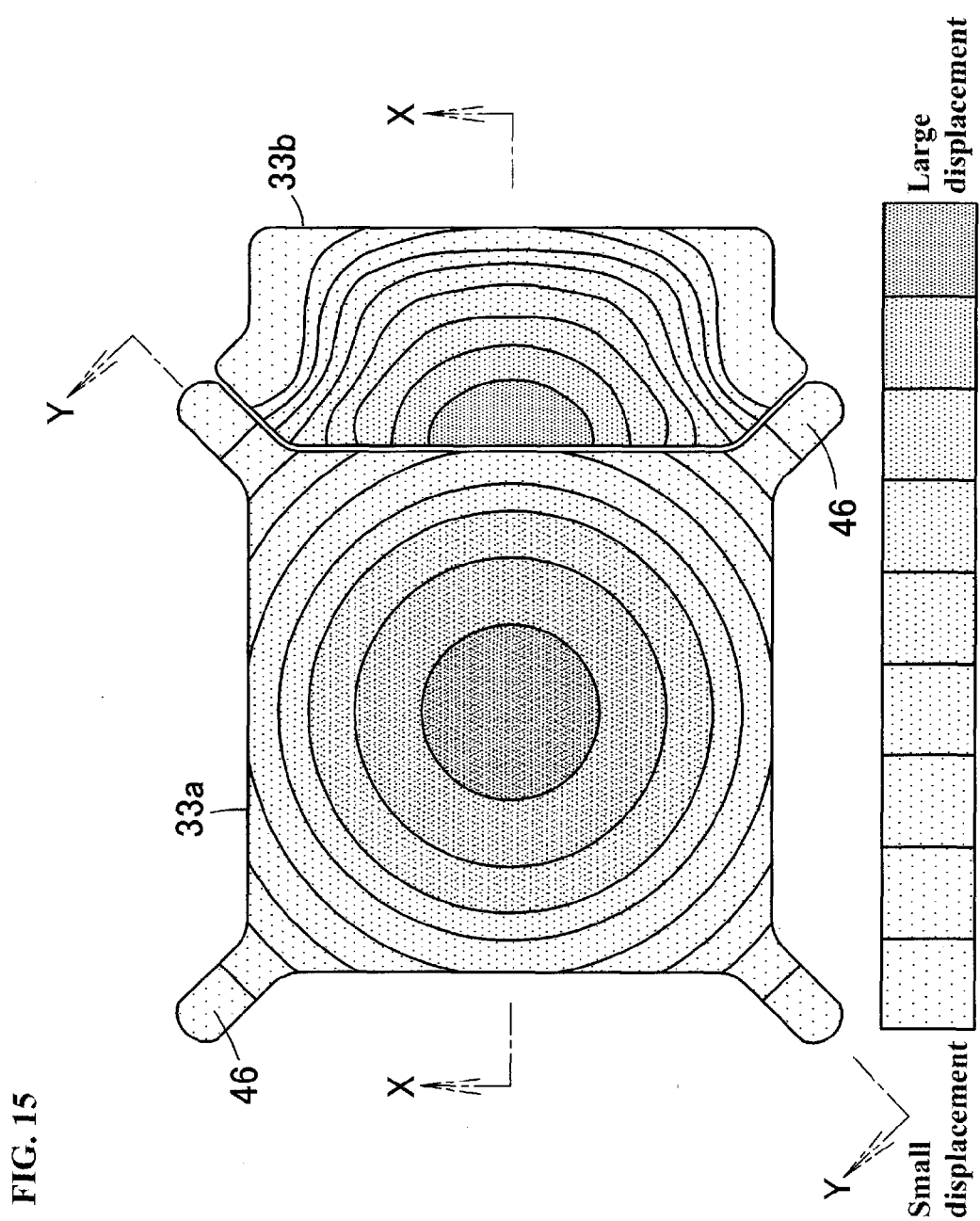
FIG. 15 is a diagram showing a distribution of displacement amounts of first and second diaphragms.

In an acoustic sensor 81 of Embodiment 3, the projection lengths of the stoppers 45a and 45b are set to change gradually. FIG. 14A is a schematic cross-sectional diagram of the acoustic sensor 81 of Embodiment 3, the cross-section being taken along line X-X in FIG. 15. FIG. 14B is a schematic cross-sectional diagram of the acoustic sensor 81 of Embodiment 3, the cross-section being taken along line Y-Y in FIG. 15. FIG. 15 shows displacement of the first diaphragm 33a and the second diaphragm 33b when pressure is applied to the two diaphragms 33a and 33b. In FIG. 15, regions with a higher dot density indicate larger displacement, and regions with a lower dot density indicate smaller displacement.

In the acoustic sensor 81 of Embodiment 3, the projection lengths of the stoppers 45a and 45b are set to change gradually such that the tips of the stoppers 45a and 45b follow the shape of the upper surfaces of the diaphragms 33a and 33b when undergoing deformation to the extent that excessive stress concentration does not occur. According to this embodiment, if the diaphragms 33a and 33b are subjected to a high pressure load, the diaphragms 33a and 33b can be supported by the stoppers 45a and 45b while maintaining a natural shape, thus making it unlikely for stress to become concentrated in the diaphragms 33a and 33b and the anchors 36a and 36b, and making it possible to further improve damage resistance.

Embodiment 4

Figure 16A:
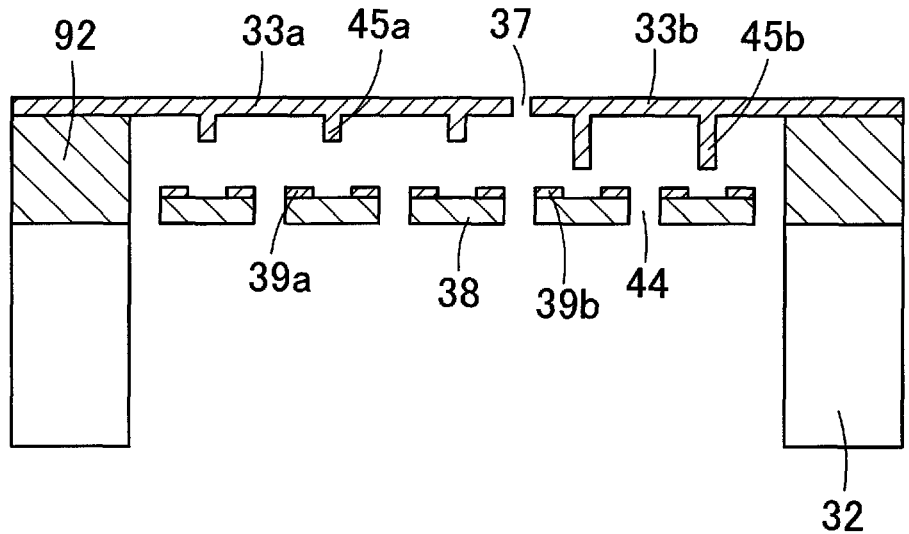
FIG. 16A is a schematic cross-sectional diagram showing an acoustic sensor according to Embodiment 4 of the present invention.

FIG. 16A is a schematic cross-sectional diagram showing an acoustic sensor 91 according to Embodiment 4 of the present invention. In one or more embodiments of the present invention, a flat plate-shaped back plate 38 is provided on the upper surface of the substrate 32. The fixed electrode plates 39a and 39b are formed on the upper surface of the back plate 38. Multiple acoustic holes 44 are formed in the back plate 38 and the fixed electrode plates 39a and 39b above the cavity 35. Also, the first diaphragm 33a and the second diaphragm 33b, which are divided by the slit 37, are arranged so as to oppose the fixed electrode plates 39a and 39b above the back plate 38. The diaphragms 33a and 33b are supported by anchor portions 92 provided on the edge of the back plate 38. Comparatively short stoppers 45a project downward from the lower surface of the first diaphragm 33a, and stoppers 45b with a longer projection length than the stoppers 45a project from the lower surface of the second diaphragm 33b. Openings are provided in the fixed electrode plates 39a and 39b at locations opposing the end surfaces of the stoppers 45a and 45b, and therefore even if the stoppers 45a and 45b come into contact with the back plate 38, the stoppers 45a and 45b do not come into contact with the fixed electrode plates 39a and 39b.

Figure 16B:
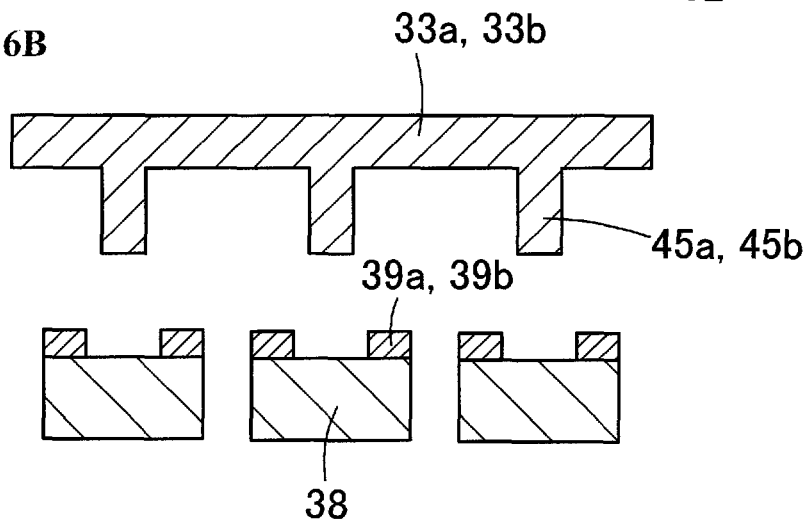
FIG. 16B is a diagram showing an enlargement of a portion of FIG. 16A.
Figure 16C:
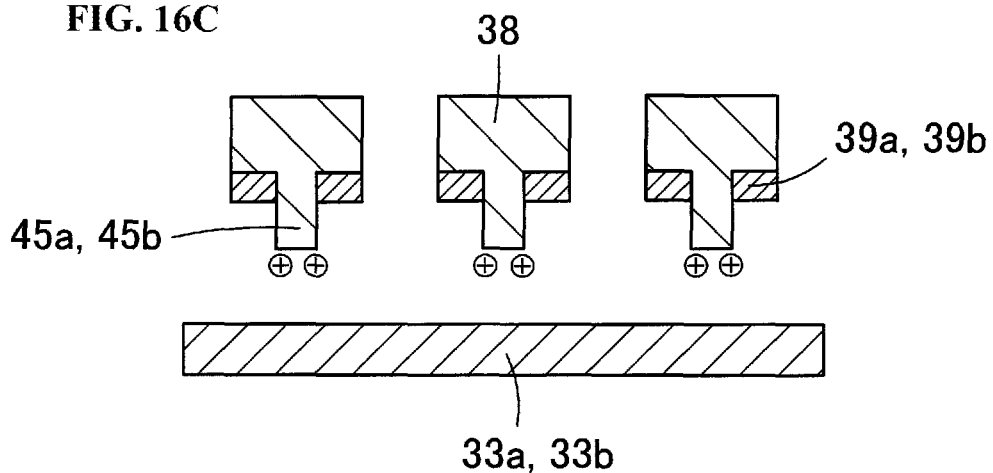
FIG. 16C is a diagram showing an enlargement of a portion of a comparative example.

As shown in FIG. 16C, in the case where the stoppers 45a and 45b are provided on the back plate 38, the stoppers 45a and 45b easily become charged due to being formed from an insulating material, and thus there is the risk of influencing the sensitivity of the acoustic sensor. In view of this, if the stoppers 45a and 45b are provided on the diaphragms 33a and 33b that are formed from a conductive material as shown in FIG. 16B, the stoppers 45a and 45b are not easily charged, thus preventing variation in the sensitivity of the acoustic sensor 91.

Embodiment 5

Figure 17:
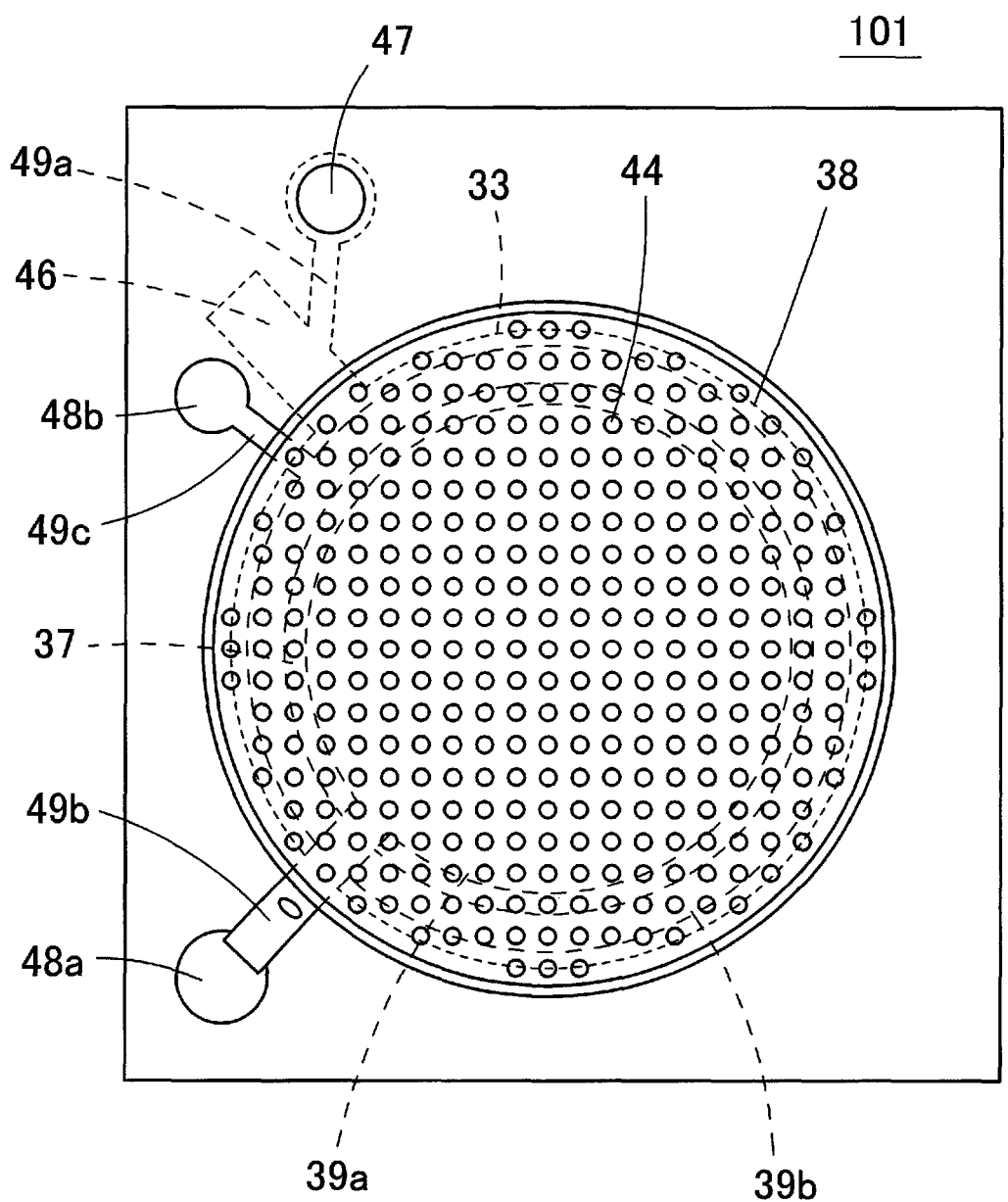
FIG. 17 is a plan view showing an acoustic sensor according to Embodiment 5 of the present invention.
Figure 18:
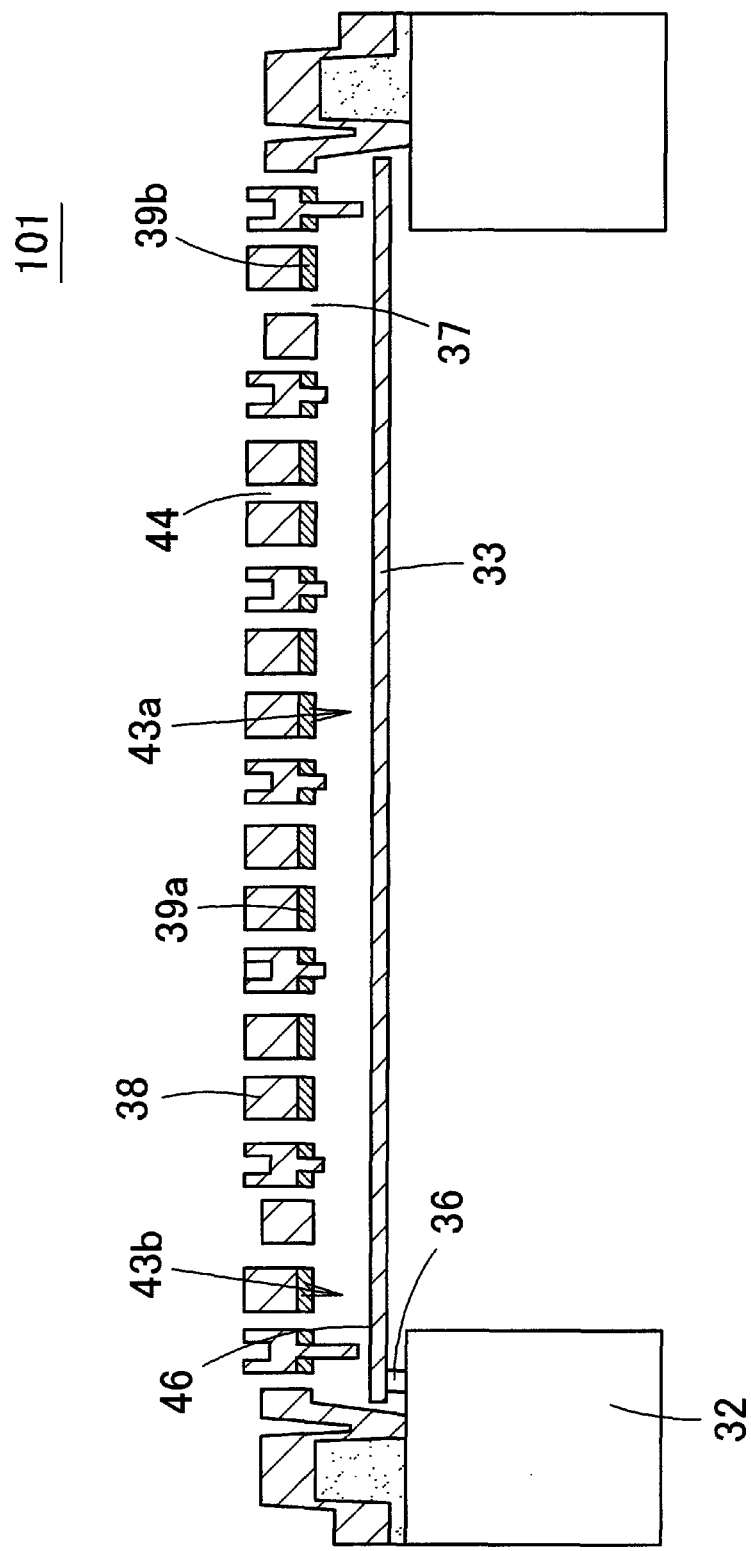
FIG. 18 is a cross-sectional diagram of the acoustic sensor in FIG. 17.
Figure 19A:
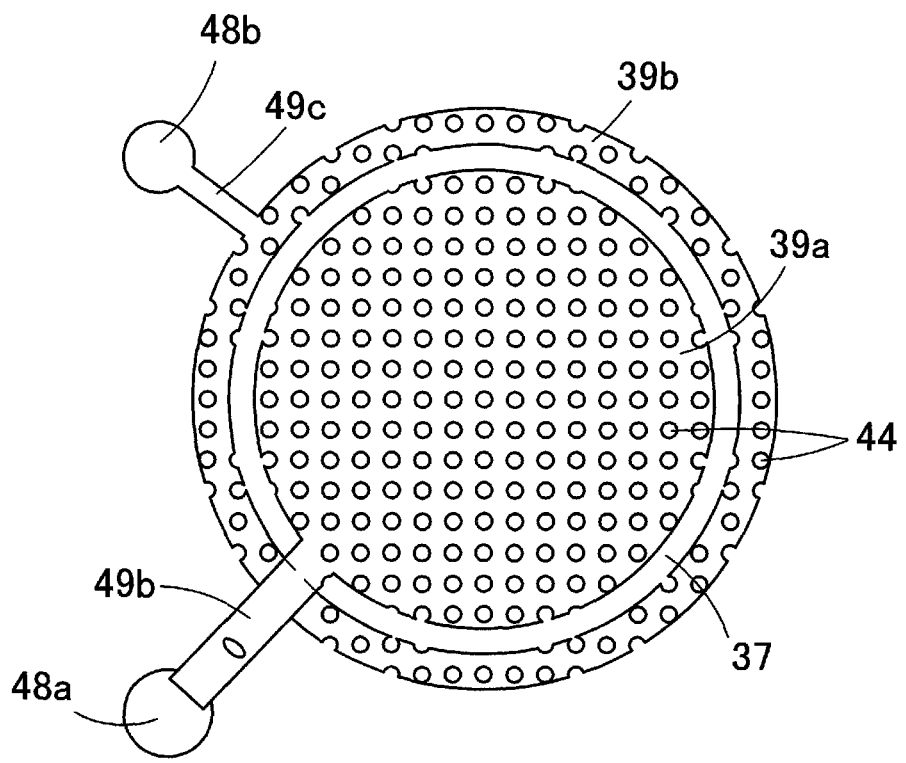
FIG. 19A is a plan view of fixed electrode plates provided on the lower surface of a back plate in the acoustic sensor in FIG. 17.
Figure 19B:
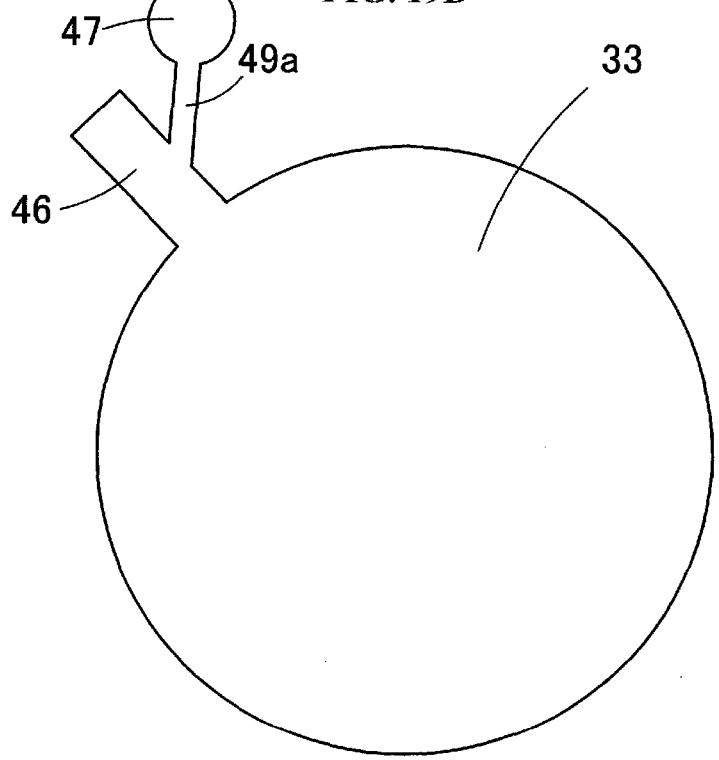
FIG. 19B is a plan view of a diaphragm used in the acoustic sensor in FIG. 17.

The electrode portions are not limited to being rectangular, and may be circular. FIG. 17 is a plan view showing an acoustic sensor 101 according to Embodiment 5 of the present invention. FIG. 18 is a cross-sectional diagram of the acoustic sensor 101. FIG. 19A is a plan view showing fixed electrode plates 39a and 39b provided on the lower surface of the back plate 38 in the acoustic sensor 101. FIG. 19B is a plan view of the diaphragm 33 used in the acoustic sensor 101.

As shown in FIG. 18, in the acoustic sensor 101, a circular diaphragm 33 is provided on the upper surface of the substrate 32. One leg piece 46 extends from the outer peripheral portion of the circular diaphragm 33, and the diaphragm 33 is supported in a cantilever manner by the leg piece 46, which is supported by an anchor 36. Also, as shown in FIGS. 17 and 19B, a lead-out interconnect 49a extends from the leg piece 46, and the lead-out interconnect 49a is connected to a common electrode pad 47.

On the other hand, as shown in FIGS. 18 and 19A, a disk-shaped first fixed electrode plate 39a is provided in the central portion of the lower surface of the back plate 38. A circular ring-shaped second fixed electrode plate 39b is provided outward of the first fixed electrode plate 39a, with a ring-shaped slit 37 therebetween. As shown in FIGS. 17 and 19A, a lead-out interconnect 49b extends from the outer peripheral portion of the first fixed electrode plate 39a, and the lead-out interconnect 49b is connected to a first electrode pad 48a. A lead-out interconnect 49c extends from the second fixed electrode plate 39b, and the lead-out interconnect 49c is connected to a second electrode pad 48b.

In the acoustic sensor 101, a circular low-volume high-sensitivity first acoustic sensing portion 43a is configured by the central portion of the diaphragm 33 and the first fixed electrode plate 39a. Also, a circular ring-shaped high-volume low-sensitivity second acoustic sensing portion 43b is configured by the outer peripheral portion of the diaphragm 33 and the second fixed electrode plate 39b.

Also, in the acoustic sensor 101 as well, comparatively short stoppers 45a project from positions on the first fixed electrode plate 39a having a large surface area, and comparatively long stoppers 45b project from positions on the second fixed electrode plate 39b having a small surface area, thus making it possible to improve sticking resistance and damage resistance.

Application in Microphone

Figure 20:
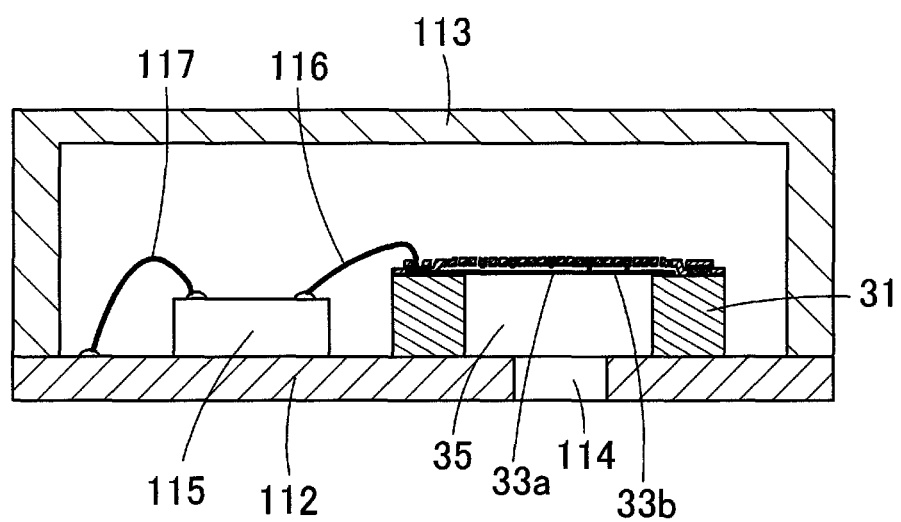

FIG. 20 is a schematic cross-sectional diagram of a bottom port type of microphone 111 including an acoustic sensor according to one or more embodiments of the present invention, such as the acoustic sensor 31 of Embodiment 1. This microphone 111 has the acoustic sensor 31 and a signal processing circuit 115 (ASIC), which is a circuit portion, built into a package made up of a circuit substrate 112 and a cover 113. The acoustic sensor 31 and the signal processing circuit 115 are mounted on the upper surface of the circuit substrate 112. A sound introduction hole 114 for the introduction of acoustic vibration into the acoustic sensor 31 is formed in the circuit substrate 112. The acoustic sensor 31 is mounted on the upper surface of the circuit substrate 112 such that the lower opening of the cavity 35 is aligned with the sound introduction hole 114 and covers the sound introduction hole 114. Accordingly, the cavity 35 of the acoustic sensor 31 is the front chamber, and the space inside the package is the back chamber.

The acoustic sensor 31 and the signal processing circuit 115 are connected by a bonding wire 116. Furthermore, the signal processing circuit 115 is connected to the circuit substrate 112 by a bonding wire 117. Note that signal processing circuit 115 has a function of supplying power to the acoustic sensor 31 and a function of outputting a capacitance change signal from the acoustic sensor 31 to the outside.

A cover 113 is attached to the upper surface of the circuit substrate 112 so as to cover the acoustic sensor 31 and the signal processing circuit 115. The package has an electromagnetic shielding function, and protects the acoustic sensor 31 and the signal processing circuit 115 from mechanical shock and electrical disturbances from the outside.

In this way, acoustic vibration that has entered the cavity 35 through the sound introduction hole 114 is detected by the acoustic sensor 31, and then output after being subjected to amplification and signal processing by the signal processing circuit 115. Since the space inside the package is the back chamber in this microphone 111, the area of the back chamber can be increased, and the sensitivity of the microphone 111 can be increased.

Note that in this microphone 111, the sound introduction hole 114 for introducing acoustic vibration into the package may be formed in the upper surface of the cover 113. In this case, the cavity 35 of the acoustic sensor 31 is the back chamber, and the space inside the package is the front chamber.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

LIST OF REFERENCE NUMERALS 31, 71, 81, 91, 101 acoustic sensor
32 substrate
33 diaphragm
33a first diaphragm
33b second diaphragm
37 slit
38 back plate
39 fixed electrode plate
39a first fixed electrode plate
39b second fixed electrode plate
43a first acoustic sensing portion
43b second acoustic sensing portion
44 acoustic hole
45a, 45b stopper
111 microphone

The invention claimed is:

1. A capacitance-type transducer comprising:
a back plate having a fixed electrode;
a diaphragm that opposes the back plate via an air gap and serves as a movable electrode; and
at least first stoppers having a first projection length and second stoppers having a second projection length that project from at least one of a surface of the back plate on the air gap side and a surface of the diaphragm on the air gap side,
wherein at least one of the diaphragm and the fixed electrode is divided into at least a first region having a first surface area and a second region having a second surface area, a first sensing portion made up of the diaphragm and the fixed electrode is constituted in the first region, and a second sensing portion made up of the diaphragm and the fixed electrode is constituted in the second region, wherein the first stoppers are provided on the first sensing portion, wherein the second stoppers are provided on the second sensing portion, wherein the first surface area of the first region is larger than the second surface area of the second region, and wherein the projection length of the first stoppers is shorter than the projection length of the second stoppers.

2. The capacitance-type transducer according to claim 1, wherein a region of the fixed electrode that opposes the diaphragm in the first sensing portion and a region of the fixed electrode that opposes the diaphragm in the second sensing portion constitute one flat surface.

3. The capacitance-type transducer according to claim 2, wherein in the first sensing portion, the first stoppers have a shorter projection length in a large displacement region of the diaphragm or a region that opposes the large displacement region, and the first stoppers have a longer projection length in a small displacement region of the diaphragm or a region that opposes the small displacement region.

4. The capacitance-type transducer according to claim 2, wherein in the second sensing portion, the second stoppers have a shorter projection length in a large displacement region of the diaphragm or a region that opposes the large displacement region, and the second stoppers have a longer projection length in a small displacement region of the diaphragm or a region that opposes the small displacement region.

5. The capacitance-type transducer according to claim 2, wherein the second stoppers are thicker than the first stoppers.

6. The capacitance-type transducer according to claim 2, further comprising:
a plurality of stoppers that include the first stoppers and the second stoppers,
wherein a number density of stoppers in a vicinity of the second stoppers is greater than a number density of stoppers in a vicinity of the first stoppers.

7. The capacitance-type transducer according to claim 1, wherein a longest projection length among projection lengths of the second stoppers is longer than a longest projection length among projection lengths of the first stoppers.

8. The capacitance-type transducer according to claim 1, wherein a shortest projection length among projection lengths of the second stoppers is longer than a shortest projection length among projection lengths of the first stoppers.

9. The capacitance-type transducer according to claim 1, wherein in the first sensing portion, the first stoppers have a shorter projection length in a large displacement region of the diaphragm or a region that opposes the large displacement region, and the first stoppers have a longer projection length in a small displacement region of the diaphragm or a region that opposes the small displacement region.

10. The capacitance-type transducer according to claim 9, wherein a plurality of stoppers including the first stoppers protrude from the back plate in the first sensing portion, and
wherein, in the first sensing portion, the projection lengths of the plurality of stoppers are selected such that tips of the plurality of stoppers are aligned along a shape of the diaphragm in a deformed state of the diaphragm.

11. The capacitance-type transducer according to claim 1, wherein in the second sensing portion, the second stoppers have a shorter projection length in a large displacement region of the diaphragm or a region that opposes the large displacement region, and the second stoppers have a longer projection length in a small displacement region of the diaphragm or a region that opposes the small displacement region.

12. The capacitance-type transducer according to claim 11, wherein a plurality of stoppers including the second stoppers protrude from the back plate in the second sensing portion, and
wherein, in the second sensing portion, the projection lengths of the plurality of stoppers are selected such that tips of the plurality of stoppers are aligned along a shape of the diaphragm in a deformed state of the diaphragm.

13. The capacitance-type transducer according to claim 1, wherein the second stoppers are thicker than the first stoppers.

14. The capacitance-type transducer according to claim 1, further comprising:
a plurality of stoppers that include the first stoppers and the second stoppers,
wherein a number density of stoppers in a vicinity of the second stoppers is greater than a number density of stoppers in a vicinity of the first stoppers.

15. The capacitance-type transducer according to claim 1, wherein the first stoppers and the second stoppers are manufactured using the same material as the back plate and in the same step as the back plate.

16. An acoustic sensor comprising:
the capacitance-type transducer according to claim 1; and
acoustic holes for allowing passage of acoustic vibration formed in the back plate.

17. A microphone comprising:
the acoustic sensor according to claim 16; and
a circuit portion that amplifies a signal from the acoustic sensor and outputs the amplified signal to the outside.

18. The capacitance-type transducer according to claim 1, wherein the first stoppers and the second stoppers are manufactured using the same material as the back plate and in the same step as the back plate.

* * * * *